(12) United States Patent
Park et al.

(10) Patent No.: US 11,446,878 B2
(45) Date of Patent: Sep. 20, 2022

(54) ULTRASONIC BONDING APPARATUS AND METHOD FOR ULTRASONIC BONDING USING THE SAME

(71) Applicant: Samsung Display Co., Ltd., Yongin-Si (KR)

(72) Inventors: Chan-Jae Park, Suwon-si (KR); Minsoo Kim, Seoul (KR); Yoona Kim, Hwaseong-si (KR); Soo Yeon Han, Gwacheon-si (KR); Sunok Oh, Hwaseong-si (KR); Kikyung Youk, Bucheon-si (KR); Sangduk Lee, Yongin-si (KR); Hyun A Lee, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 17/388,475

(22) Filed: Jul. 29, 2021

(65) Prior Publication Data

US 2022/0055313 A1 Feb. 24, 2022

(30) Foreign Application Priority Data

Aug. 18, 2020 (KR) ........................ 10-2020-0103385

(51) Int. Cl.
*B29C 65/00* (2006.01)
*B29C 65/08* (2006.01)
*H05K 3/30* (2006.01)
*B29C 65/48* (2006.01)
*B29L 31/34* (2006.01)

(52) U.S. Cl.
CPC .............. *B29C 65/08* (2013.01); *B29C 65/48* (2013.01); *B29C 66/47* (2013.01); *H05K 3/303* (2013.01); *B29C 65/081* (2013.01); *B29C 65/088* (2013.01); *B29L 2031/3475* (2013.01)

(58) Field of Classification Search
CPC ...... B29C 65/08; B29C 65/081; B29C 65/088
See application file for complete search history.

(56) References Cited

U.S. PATENT DOCUMENTS

| 8,973,807 B2 | 3/2015 | Fujita et al. |
| 2008/0265002 A1 | 10/2008 | Kainuma et al. |
| 2013/0026211 A1* | 1/2013 | Fujita ...................... B23K 1/00 228/110.1 |
| 2021/0094238 A1 | 4/2021 | Lee et al. |

FOREIGN PATENT DOCUMENTS

| KR | 100950977 B1 | 4/2010 |
| KR | 101385803 B1 | 4/2014 |
| KR | 1020210038760 A | 4/2021 |

\* cited by examiner

*Primary Examiner* — Philip C Tucker
*Assistant Examiner* — Nickolas R Harm
(74) *Attorney, Agent, or Firm* — Cantor Colburn LLP

(57) ABSTRACT

An ultrasonic bonding apparatus includes a stage having an upper surface on a plane defined by a first direction and a second direction crossing the first direction, a head part spaced apart from the stage in a third direction crossing the first direction and the second direction, a first ultrasonic generator which vibrates in a direction parallel to the first direction, and a second ultrasonic generator which vibrates in a direction parallel to the third direction, where each of the first ultrasonic generator and the second ultrasonic generator may be coupled to the stage or the head part.

20 Claims, 15 Drawing Sheets

ULTRASONIC BONDING APPARATUS AND METHOD FOR ULTRASONIC BONDING USING THE SAME

This application claims priority to Korean Patent Application No. 10-2020-0103385, filed on Aug. 18, 2020, and all the benefits accruing therefrom under 35 U.S.C. § 119, the content of which in its entirety is herein incorporated by reference.

BACKGROUND

1. Field

The disclosure herein relates to an ultrasonic bonding apparatus having improved bonding reliability and a method for ultrasonic bonding using the ultrasonic bonding apparatus.

2. Description of the Related Art

Display devices used in smartphones, television sets, monitors, etc. include various elements such as a display panel, a touch sensor, and an electronic component.

The electronic component may be bonded to the display panel, using an anisotropic conductive film or an ultrasonography method. The ultrasonography method is a way of bonding through ultrasonic vibration by having terminals of each of the display panel and the electronic component brought into contact with each other.

SUMMARY

The disclosure provides an ultrasonic bonding apparatus having improved bonding reliability and a method for ultrasonic bonding using the same.

An embodiment of the invention provides an ultrasonic bonding apparatus including a stage including an upper surface on a plane defined by a first direction and a second direction crossing the first direction, a head part spaced apart from the stage in a third direction crossing the first direction and the second direction, a first ultrasonic generator which vibrates in a direction parallel to the first direction, and a second ultrasonic generator which vibrates in a direction parallel to the third direction, where each of the first ultrasonic generator and the second ultrasonic generator is coupled to the stage or the head part.

In an embodiment, the first ultrasonic generator and the second ultrasonic generator may vibrate together simultaneously.

In an embodiment, the first ultrasonic generator and the second ultrasonic generator may be coupled to the head part.

In an embodiment, the first ultrasonic generator may be coupled to the head part, and the second ultrasonic generator may be coupled to the stage.

In an embodiment, the ultrasonic bonding apparatus may further include a third ultrasonic generator coupled to the head part, where the third ultrasonic generator may vibrate in the third direction.

In an embodiment, the first ultrasonic generator may be coupled to the stage, and the second ultrasonic generator may be coupled to the head part.

In an embodiment, the ultrasonic bonding apparatus may further include a pressing part disposed on the head part, where the pressing part may press the head part in the third direction.

In an embodiment, the first ultrasonic generator may include a first converter which converts electrical signals into a first vibration vibrating in the first direction, and a first booster which amplifies an amplitude of the first vibration.

In an embodiment, the second ultrasonic generator may include a second converter which converts electrical signals into a second vibration vibrating in the third direction, and a second booster which amplifies the amplitude of the second vibration.

In an embodiment, the head part may provide at least one selected from the first vibration and the second vibration to a first object disposed on the stage and a second object fixed to the head part.

In an embodiment, each of the first vibration and the second vibration may have a frequency in a range of about 40 kilohertz (kHz) to about 60 kHz.

In an embodiment of the invention, a method for ultrasonic bonding includes providing a display panel on a stage including an upper surface on a plane defined by a first direction and a second direction crossing the first direction, fixing an electronic component to a head part spaced apart from the stage in a third direction crossing the first direction and the second direction, having the display panel and the electronic component into contact with each other, and bonding the display panel and the electronic component to each other. In such an embodiment, the bonding the display panel and the electronic component includes providing a first vibration vibrating in a direction parallel to the first direction to a contact surface contacting the display panel and the electronic component, and providing a second vibration vibrating in a direction parallel to the third direction to the contact surface.

In an embodiment, the providing the first vibration may be performed after the providing the second vibration.

In an embodiment, the providing the first vibration and the providing the second vibration may be performed together simultaneously.

In an embodiment, the first vibration and the second vibration may be provided to the contact surface through the head part.

In an embodiment, the first vibration may be provided to the contact surface through the head part, and the second vibration may be provided to the contact surface through the stage.

In an embodiment, the bonding may further include providing a third vibration vibrating in a direction parallel to the third direction to the contact surface, where the third vibration may be provided to the contact surface through the head part.

In an embodiment, the first vibration may be provided to the contact surface through the stage, and the second vibration may be provided to the contact surface through the head part.

In an embodiment, the providing the second vibration may include pushing an adhesive member disposed between the display panel and the electronic component not to overlap the contact surface.

In an embodiment, the adhesive member may include a non-conductive film.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
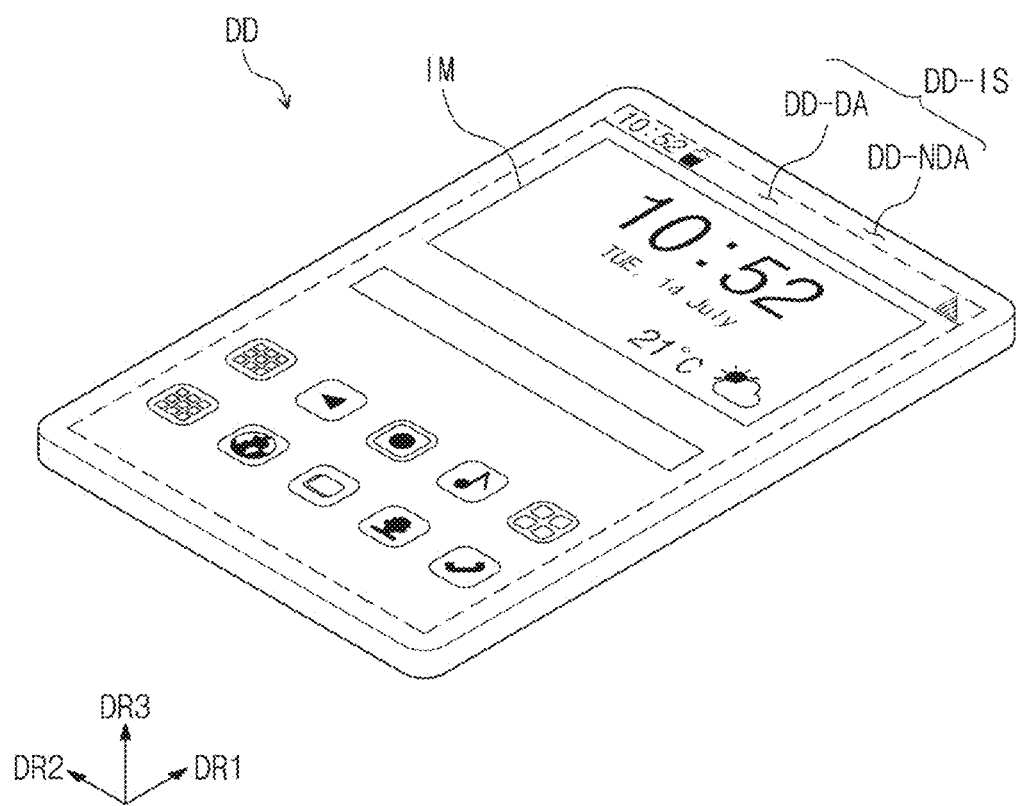
FIG. 1 is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element (or a region, a layer, a portion, etc.) is referred to as being "on," "connected to," or "coupled to" another element, it means that the element may be directly disposed on/connected to/coupled to the other element, or that a third element may be present therebetween. In contrast, when an element is referred to as being "directly on," "connected directly to," or "coupled directly to" another element, there are no intervening elements present.

Like reference numerals refer to like elements. Also, in the drawings, the thickness, the ratio, and the dimensions of elements are exaggerated for an effective description of technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a perspective view of a display device according to an embodiment of the invention.

Referring to FIG. 1, in an embodiment, a display device DD may be applicable to a mobile phone terminal. In such an embodiment, although not shown, electronic modules, a camera module, a power module, etc. mounted on a motherboard, along with the display device DD, may be disposed in a bracket, a case, etc. to form a mobile phone terminal. However, embodiments of the display device DD according to the invention are not limited thereto. An embodiment of the display device DD, for example, may be not only used for large-sized electronic devices such as a television set and a monitor, but also used for small- and medium-sized electronic devices such as a tablet, a car navigation system, a game console, and a smart watch.

The display device DD may display an image IM through a display surface DD-IS. In an embodiment, as shown in FIG. 1, the image IM may be icon images. The display surface DD-IS may be parallel to a plane defined by a first direction DR1 and a second direction DR2. The normal direction of the display surface DD-IS, that is, a thickness direction of the display device DD, may be indicated by a third direction DR3. Herein, the terms "when viewed on a plane or on a plane" may refer to a case viewed from a view point in the third direction DR3. A front surface (or an upper surface) and a rear surface (or a lower surface) of respective layers or units which will be described below are separated by the third direction DR3.

The display surface DD-IS may include a display area DD-DA for displaying the image IM, and a non-display area DD-NDA adjacent to the display area DD-DA. The non-display area DD-NDA may be an area where the image IM is not displayed. The non-display area DD-NDA may surround the display area DD-DA. However, embodiments of the invention are not limited thereto, and alternatively, the non-display area DD-NDA may be adjacent to or omitted from any one side of the display area DD-DA.

Figure 2:
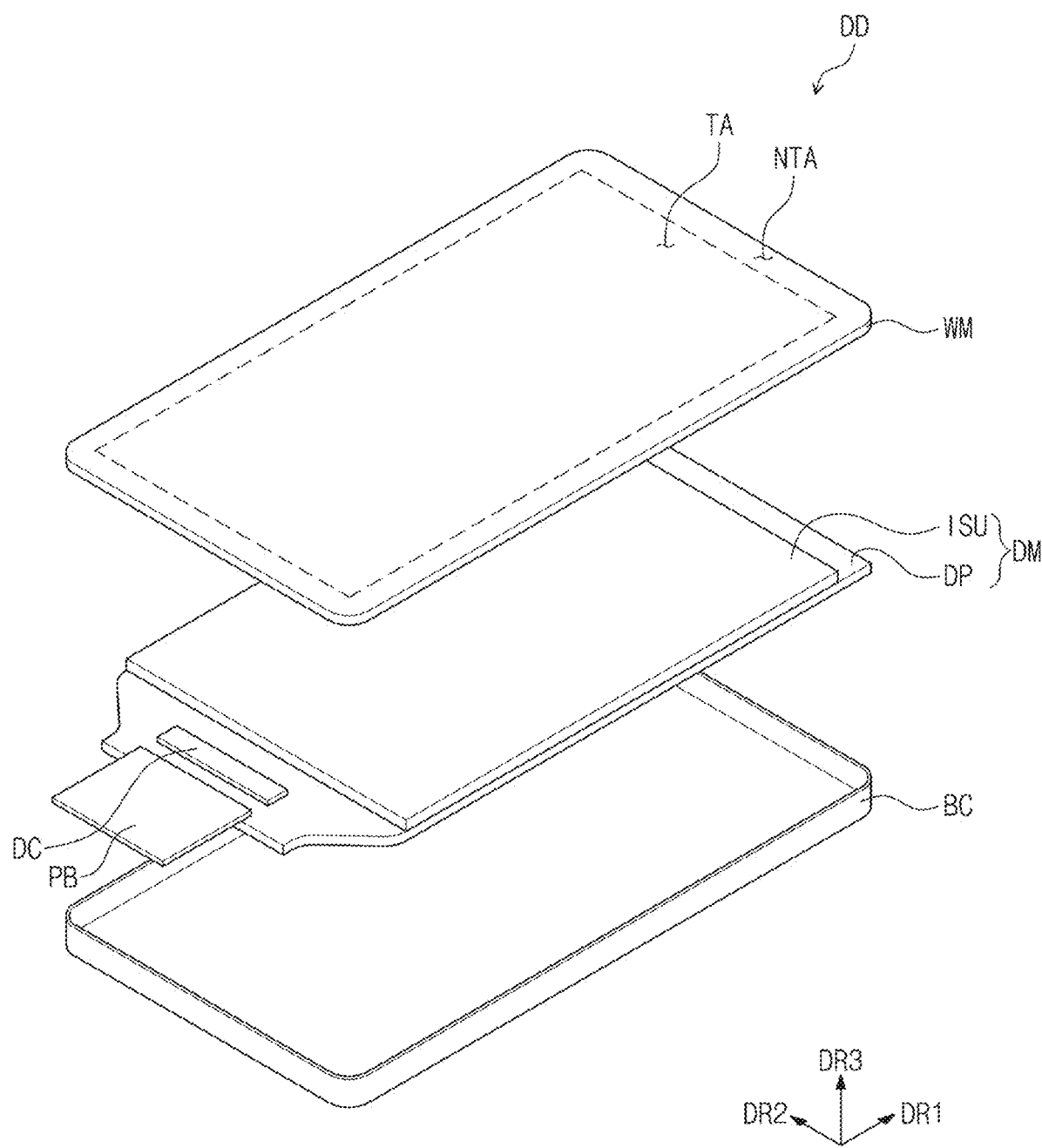
FIG. 2 is an exploded perspective view of a display device according to an embodiment of the invention.
Figure 3:
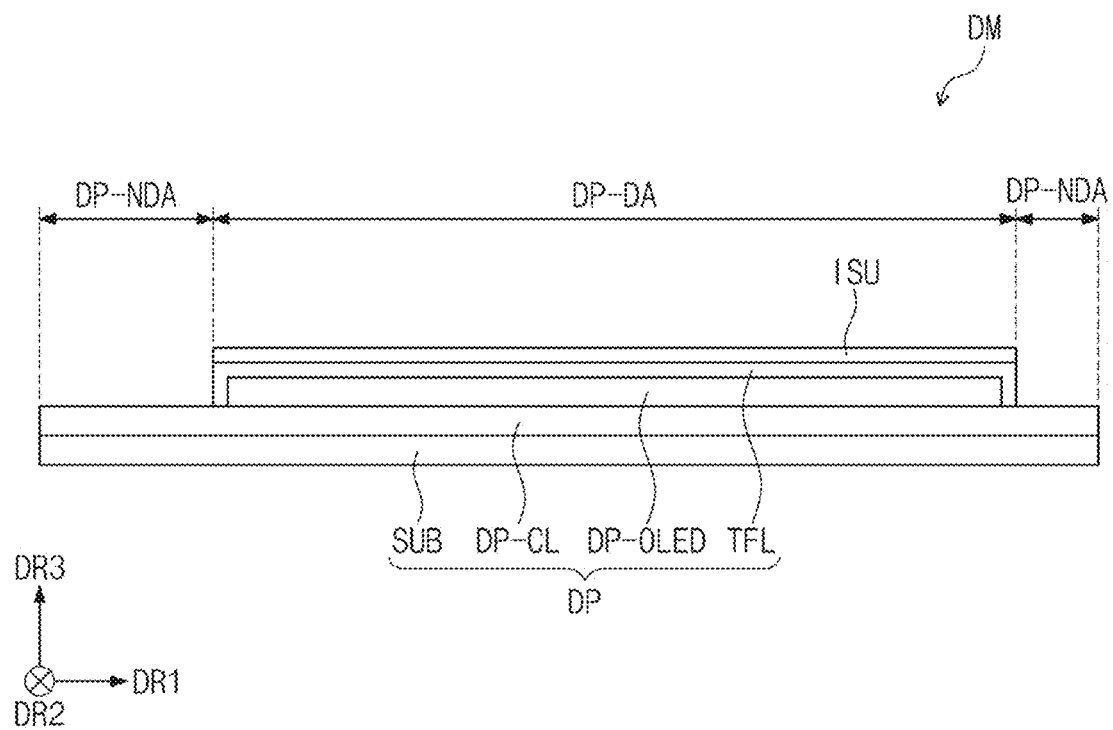
FIG. 3 is a cross-sectional view of a display module according to an embodiment of the invention.

FIG. 2 is an exploded perspective view of a display device according to an embodiment of the invention, and FIG. 3 is a cross-sectional view of a display module according to an embodiment of the invention.

Referring to FIGS. 2 and 3, an embodiment of the display device DD may include a window WM, a display module DM, an electronic component DC, a circuit board PB, and an accommodation member BC. The accommodation member BC may accommodate the display module DM to be coupled to the window WM.

The window WM may be disposed at an upper part of the display module DM. The window WM may transmit an image provided from the display module DM to the outside. The window WM may include a transmission area TA and a non-transmission area NTA. The transmission area TA may overlap the display area DD-DA (see FIG. 1) of the display device DD. The transmission area TA may have a shape corresponding to the display area DD-DA (see FIG. 1). The image IM displayed in the display area DD-DA (see FIG. 1) of the display device DD may be viewed from the outside through the transmission area TA of the window WM.

The non-transmission area NTA may overlap the non-display area DD-NDA (see FIG. 1) of the display device DD. The non-transmission area NTA may have a shape corresponding to the non-display area DD-NDA (see FIG. 1). The non-transmission area NTA may be an area having a relatively lower light transmittance than the transmission area TA. However, embodiments of the window WM of the invention are not limited thereto, and alternatively, the non-transmission area NTA may be omitted.

In an embodiment, the window WM may include or be formed of glass, sapphire, plastic, etc. In an embodiment, the window WM may have a single layer structure or a multi-layer structure. The window WM may include a printing layer overlapping the base layer and the non-transmission area NTA and disposed on a rear surface of the base layer. The printing layer may have a predetermined color. In one embodiment, for example, the printing layer may be provided in a black color, or may be provided in a color other than black.

The display module DM may be disposed between the window WM and the accommodation member BC. The display module DM may include a display panel DP and an input sensor ISU. The display panel DP may generate an image and transmit the generated image to the window WM.

An embodiment of the display panel DP according to the invention may be a light emitting display panel, but is not particularly limited. In one embodiment, for example, the display panel DP may be an organic light emitting display panel, a quantum dot light emitting display panel, a micro light emitting diode ("LED") light emitting display panel, or a nano LED light emitting display panel. An emission layer of the organic light emitting display panel may include an organic light emitting material. An emission layer of the quantum dot light emitting display panel may include quantum dots, quantum rods, etc. An emission layer of the micro LED light emitting display panel may include a micro LED. An emission layer of the nano LED light emitting display panel may include a nano LED. Hereinafter, for convenience of description, embodiments where the display panel DP is an organic light emitting display panel will be described in detail. However, embodiments of the invention are not limited thereto, and alternatively the display panel DP may be one of other various types of display panel.

In an embodiment, as shown in FIG. 3, the display panel DP may include a base substrate SUB, a circuit element layer DP-CL, a display element layer DP-OLED, and an insulating layer TFL.

The display panel DP may include a display area DP-DA and a non-display area DP-NDA. The display area DP-DA of the display panel DP may overlap the display area DD-DA (see FIG. 1) of the display device DD and the transmission area TA of the window WM. The non-display area DP-NDA of the display panel DP may overlap the non-display area DD-NDA (see FIG. 1) of the display device DD or the non-transmission area NTA of the window WM.

The base substrate SUB may be a glass substrate, a metal substrate, a polymer substrate, etc. However, embodiments of the invention are not limited thereto, and the base substrate SUB may include an inorganic layer, an organic layer, or a composite material layer.

The circuit element layer DP-CL may be disposed on the base substrate SUB. The circuit element layer DP-CL may include an intermediate insulating layer and a circuit element. The intermediate insulating layer may include an intermediate inorganic film and an intermediate organic film. The circuit element may include signal lines and pixels driving circuits.

The display element layer DP-OLED may be disposed on the circuit element layer DP-CL. The display element layer DP-OLED may include a plurality of organic light emitting diodes. The display element layer DP-OLED may further include an organic film such as a pixel defining film.

The insulating layer TFL may cover the display element layer DP-OLED. The insulating layer TFL may be a thin film encapsulation layer. The insulating layer TFL may protect the display element layer DP-OLED from foreign substances such as moisture, oxygen, and dust particles. In an alternative embodiment, the insulating layer TFL may be omitted, and an encapsulation substrate may be provided instead of the insulating layer TFL. In such an embodiment, the encapsulation substrate may face the base substrate SUB, and the circuit element layer DP-CL and the display element layer DP-OLED may be disposed between the encapsulation substrate and the base substrate SUB.

The input sensor ISU may be disposed between the window WM and the display panel DP. The input sensor ISU may sense inputs applied from an outside. The inputs applied from the outside may be provided in various forms. In one embodiment, for example, the external inputs may have a variety of forms such as a part of a user's body, a stylus pen, light, heat, or pressure. In an embodiment, close or adjacent spatial touches (e.g., hovering) may also be a form of an input, in addition to inputs in which a part of a user's body such as a user's hand contacts.

The input sensor ISU may be disposed directly on the display panel DP. Herein, "an element A is disposed directly on an element B" indicates that no adhesive layers are disposed between the element A and the element B. In an embodiment, the input sensor ISU may be formed through a continuous process along with the display panel DP. However, embodiments of the invention are not limited thereto, and alternatively, the input sensor ISU may be provided as a separate panel to be coupled to the display panel DP through an adhesive layer. In another alternative embodiment, the input sensor ISU may be omitted.

In an embodiment, as shown in FIG. 2, the electronic component DC may overlap the non-display area DD-NDA (see FIG. 1) and be disposed on the display panel DP. In one embodiment, for example, the electronic component DC may transmit signals to the circuit element layer DP-CL of the display panel DP based on control signals transmitted from the circuit board PB. An embodiment of the electronic component DC according to the invention may be a driving chip DC.

According to an embodiment of the invention, the electronic component DC may be electrically bonded onto the base substrate SUB through an ultrasonic bonding method. An embodiment of the display panel DP according to the invention may include a pad electrically connected to the display element layer DP-OLED, and the electronic component DC may include a bump electrically contacting the pad. In such an embodiment, the pad of the display panel DP and the bump of the electronic component DC may have a structure which is connected directly to each other, not a structure which is indirectly connected to each other through a separate conductive material. Such a structure will be described later in detail.

The circuit board PB may be disposed at one end of the base substrate SUB, and electrically connected to the circuit element layer DP-CL. The circuit board PB may be rigid or flexible. In one embodiment, for example, where the circuit board PB is flexible, the circuit board PB may be provided as a flexible printed circuit board. The circuit board PB may include a timing control circuit that controls the operation of the display panel DP. The timing control circuit may be disposed or mounted on the circuit board PB in the form of an integrated chip. In an embodiment, although not shown, the circuit board PB may include an input sensing circuit that controls the input sensor ISU.

According to an embodiment of the invention, the circuit board PB may be electrically bonded onto the base substrate SUB of the display panel DP through an ultrasonic bonding method.

Figure 4:
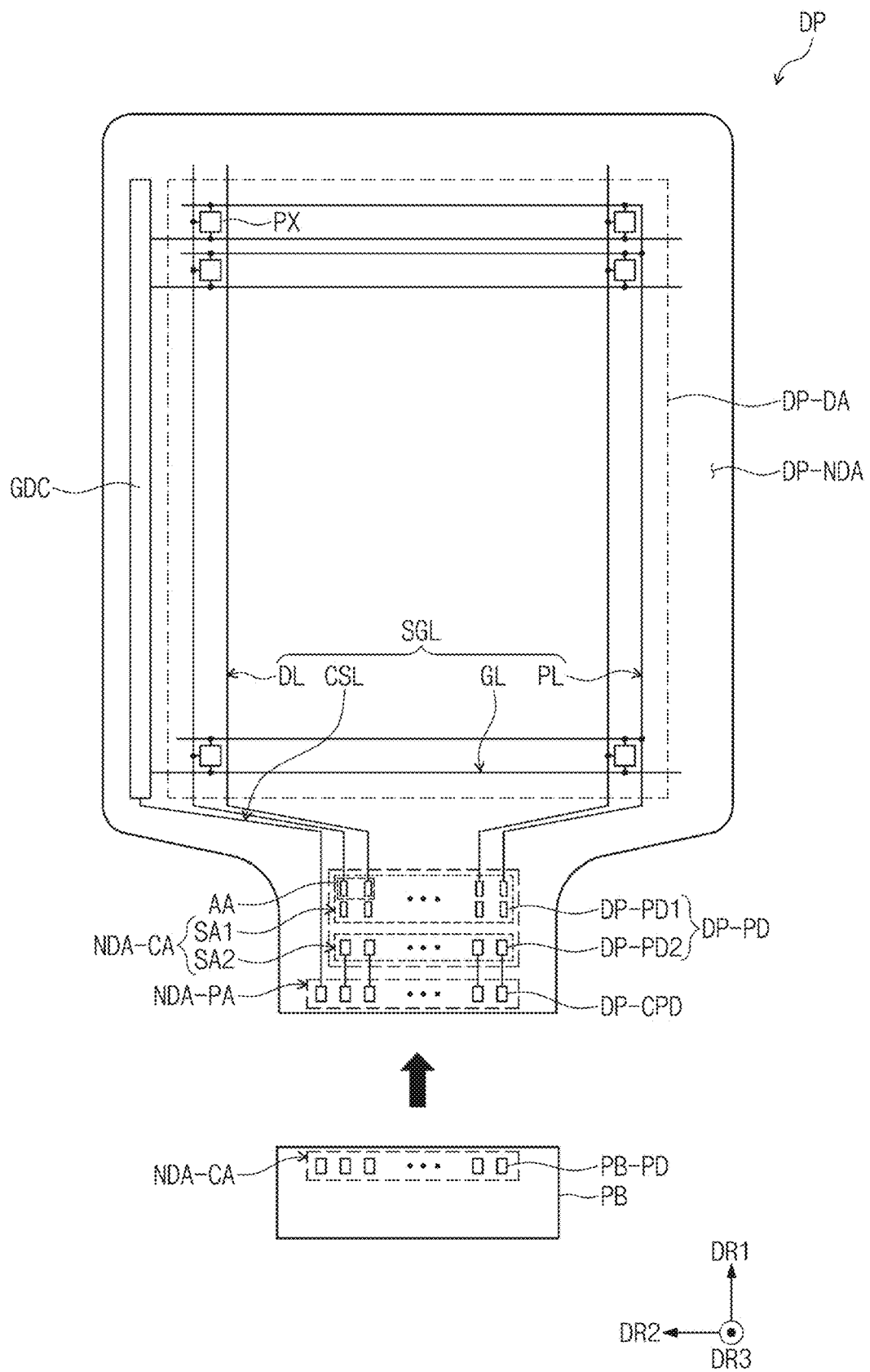
FIG. 4 is a plan view of a display panel according to an embodiment of the invention.

FIG. 4 is a plan view of a display panel according to an embodiment of the invention.

Referring to FIG. 4, an embodiment of the display panel DP may include a driving circuit GDC, a plurality of signal lines SGL, a plurality of pads DP-PD, a plurality of connection pads DP-CPD, and a plurality of pixels PX.

The plurality of pixels PX may be disposed in the display area DP-DA. The plurality of pixels PX each may include an organic light emitting diode and a pixel driving circuit connected thereto. The driving circuit GDC, the plurality of signal lines SGL, the plurality of pads DP-PD, the plurality of connection pads DP-CPD, and the pixel driving circuit may be included in the circuit element layer DP-CL (see FIG. 3).

In an embodiment, the display panel DP may be referred to as a display substrate, and the display substrate may include a base substrate SUB, a plurality of pads DP-PD disposed on the base substrate SUB, and a plurality of connection pads DP-CPD.

The driving circuit GDC may sequentially output gate signals to a plurality of gate lines GL. The driving circuit GDC may further output another control signal to the plurality of pixels PX. The driving circuit GDC may include a plurality of thin film transistors formed through a same process as the driving circuits of the plurality of pixels PX, for example, a low temperature polycrystalline silicon ("LTPS") process or a low temperature polycrystalline oxide ("LTPO") process.

The plurality of signal lines SGL may include a plurality of gate lines GL, a plurality of data lines DL, a power line PL, and a control signal line CSL. The plurality of gate lines GL each may be connected to a corresponding pixel PX among the plurality of pixels PX, and the plurality of data lines DL each may be connected to a corresponding pixel PX among the plurality of pixels PX. The power line PL may be connected to the plurality of pixels PX. The control signal line CSL may provide control signals to a scan driving circuit.

The plurality of signal lines SGL may be disposed in the display area DP-DA and the non-display area DP-NDA. The plurality of signal lines SGL each may include a pad portion and a line portion. The line portion may overlap the display area DP-DA and the non-display area DP-NDA. The pad portion may be connected to an end of the line portion. The pad portion may overlap the non-display area DP-NDA. In an embodiment, the plurality of signal lines SGL may include a line portion and a pad portion, which are integrally formed with each other as a single unitary unit, but not being limited thereto. Alternatively, the line portion and the pad portion may be provided as separate components.

The non-display area DP-NDA may include a chip area NDA-CA in which the plurality of pads DP-PD overlap and a connection pad area NDA-PA in which the plurality of connection pads DP-CPD overlap. The chip area NDA-CA may be an area where the electronic component DC (see FIG. 2) is mounted. The connection pad area NDA-PA may be an area where a part of the circuit board PB is mounted.

The chip area NDA-CA may include a first pad area SA1 and a second pad area SA2 spaced apart from each other in the first direction DR1. Although not shown, an area between the first pad area SA1 and the second pad area SA2 may be defined as a non-pad area.

The plurality of pads DP-PD may be electrically connected to the electronic component DC to transmit electrical signals received from the electronic component DC to the plurality of signal lines SGL. The plurality of pads DP-PD may include a plurality of first pads DP-PD1 overlapping the first pad area SA1, and a plurality of second pads DP-PD2 overlapping the second pad area SA2.

The plurality of first pads DP-PD1 may be arranged with a first interval in the second direction DR2. The plurality of first pads DP-PD1 may be disposed on the base substrate SUB to overlap the first pad area SA1. The plurality of first pads DP-PD1 may include a plurality of row pads partitioned in the first direction DR1. The plurality of second pads DP-PD2 may be arranged with a second interval in the second direction DR2. The second interval may be different from the first interval. The plurality of second pads DP-PD2 may be disposed on the base substrate SUB to overlap the second pad area SA2.

The plurality of first pads DP-PD1 may include first row pads and second row pads partitioned in the first direction DR1. The plurality of second pads DP-PD2 may be defined by pads of a single row. According to an embodiment of the invention, the number of the plurality of first pads DP-PD1 depends on the number of the plurality of signal lines SGL, and the number of the plurality of first pads DP-PD1 may be greater than the number of the plurality of second pads DP-PD2.

The plurality of first pads DP-PD1 may be connected to output pads each electrically connected to the plurality of signal lines SGL. The plurality of first pads DP-PD1 may be connected to the pad portions of the plurality of signal lines SGL described above, respectively. The plurality of second pads DP-PD2 may be electrically connected to the plurality of connection pads DP-CPD, respectively.

The plurality of connection pads DP-CPD may be arranged at regular intervals in the second direction DR2. The plurality of connection pads DP-CPD may be disposed on the base substrate SUB to overlap the connection pad area NDA-PA. Some of the plurality of connection pads DP-CPD may be electrically connected to the plurality of second pads DP-PD2 disposed in the second pad area SA2, respectively, and the remaining pads may be electrically connected to a corresponding signal line among the plurality of signal lines SGL. In one embodiment, for example, one of the plurality of connection pads DP-CPD may be connected to the control signal line CSL.

The circuit board PB may include a plurality of circuit pads PB-PD each electrically contacting the plurality of connection pads DP-CPD facing in the third direction DR3. The plurality of circuit pads PB-PD may be disposed in a circuit pad area NDA-PCA defined on the circuit board PB.

Figure 5:
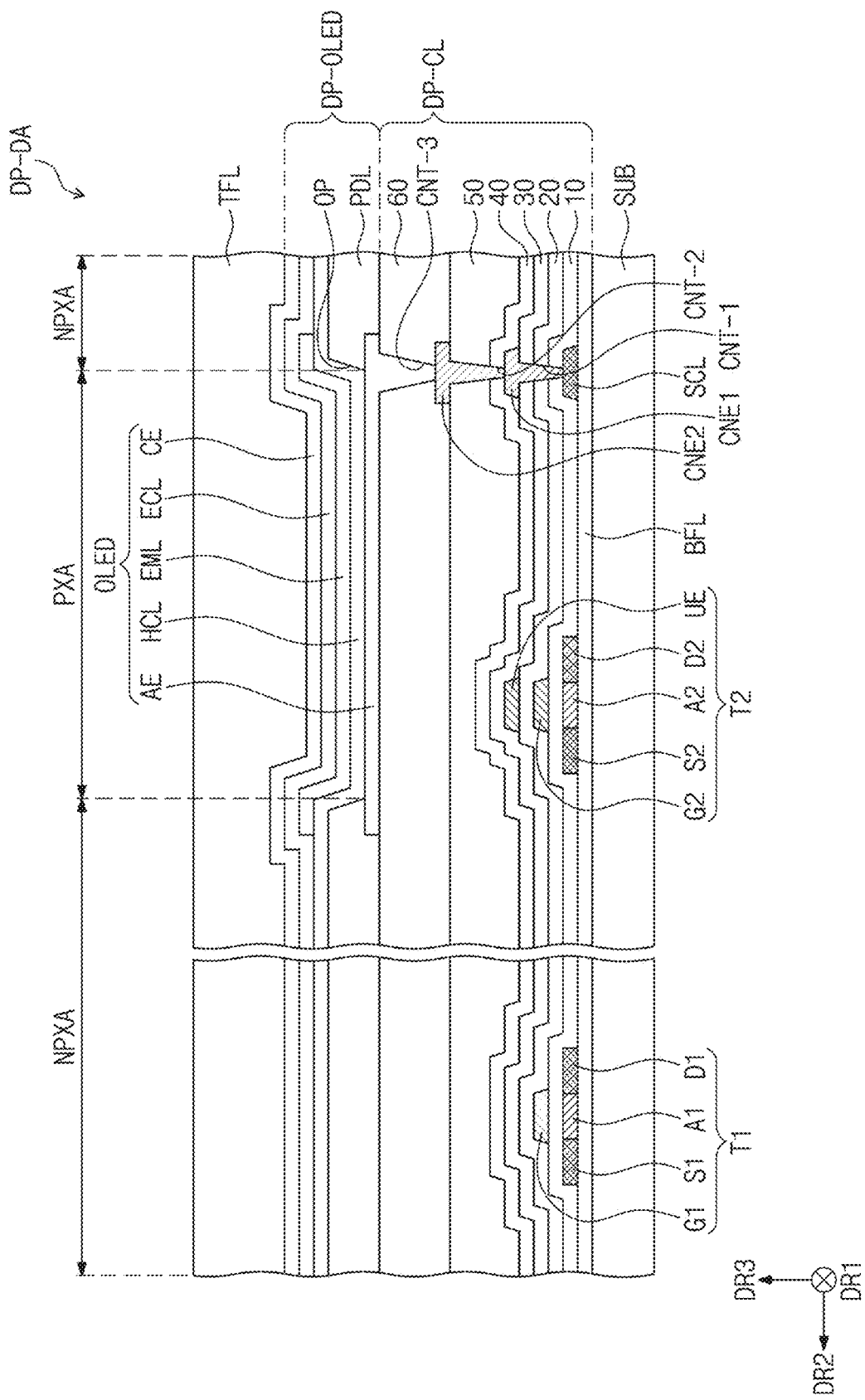
FIG. 5 is a cross-sectional view of a display panel according to an embodiment of the invention.

FIG. 5 is a cross-sectional view of a display panel according to an embodiment of the invention.

Referring to FIG. 5, an embodiment of a display panel DP0 may include a plurality of insulating layers, a semiconductor pattern, a conductive pattern, a signal line, etc. In such an embodiment, an insulating layer, a semiconductor layer, and a conductive layer may be formed through methods such as coating or evaporation. Thereafter, the insulating layer, the semiconductor layer, and the conductive layer may be selectively patterned through a photolithography method. Through the process, a semiconductor pattern, a conductive pattern, signal lines, etc. included in the circuit element layer DP-CL and the display element layer DP-OLED may be formed. The base substrate SUB may be a base substrate that supports the circuit element layer DP-CL and the display element layer DP-OLED.

The base substrate SUB may include a synthetic resin layer. The synthetic resin layer may include a thermosetting resin. The base substrate SUB may have a multilayer structure. In one embodiment, for example, the base substrate SUB may include a first synthetic resin layer, a silicon oxide (SiOx) layer disposed on the first synthetic resin layer, an amorphous silicon ("a-Si") layer disposed on the silicon oxide layer, and a second synthetic resin layer disposed on the a-Si layer. The silicon oxide layer and the a-Si layer may be referred to as a base barrier layer. The first and second synthetic resin layers each may include a polyimide-based resin. In an embodiment, the first and second synthetic resin layers each may include at least one selected from an acrylic-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. Herein, "A"-based resin indicates that a functional group of "A" is included. In an embodiment, the base substrate SUB may include a glass substrate, an organic/inorganic composite material substrate, or the like, for example.

An inorganic layer may be disposed on an upper surface of the base substrate SUB. The inorganic layer may include at least one selected from aluminum oxide, titanium oxide, silicon oxide, silicon oxynitride, zirconium oxide, and hafnium oxide. The inorganic layer may have a multilayer structure. The multilayer inorganic layers may include a barrier layer and/or a buffer layer. In one embodiment, for example, the display panel DP includes a buffer layer BFL, as shown in FIG. 5.

The buffer layer BFL may improve bonding force between the base substrate SUB and the semiconductor pattern. The buffer layer BFL may include a silicon oxide layer and a silicon nitride layer. The silicon oxide layer and the silicon nitride layer may be alternately stacked one on another.

The semiconductor pattern may be disposed on the buffer layer BFL. The semiconductor pattern may include polysilicon. However, embodiments of the invention are not limited thereto, and alternatively, the semiconductor pattern may include amorphous silicon or metal oxide.

FIG. 5 illustrates only a part of a semiconductor pattern, and the semiconductor pattern may be further disposed in another area of the pixels PX on a plane. The semiconductor pattern may be arranged based on a specific pattern over the plurality of pixels PX. The semiconductor pattern may have different electrical properties according to the application or non-application of doping. The semiconductor pattern may include a first area having high conductivity and a second area having low conductivity. The first area may be doped with an N-type dopant or a P-type dopant. A P-type transistor may include an area doped with the P-type dopant, and an N-type transistor may include an area doped with the N-type dopant. The second area may be an undoped area or may be doped at a lower concentration than the first area.

The first area has greater conductivity than the second area, and may substantially serve as an electrode or a signal line. The second area may substantially correspond to an active (or a channel) of a transistor. In such an embodiment, a part of the semiconductor pattern may be an active portion of the transistor, the other part may be a source portion or a drain portion of the transistor, and another part may be a connection electrode or a connection signal line.

Pixels each may have an equivalent circuit including seven transistors, a single capacitor, and a light emitting element, and the equivalent circuit diagram of the pixels may be modified in various forms. FIG. 5 illustrates only two transistors T1 and T2 and a light emitting element OLED included in the pixels, for convenience of illustration and description. The first transistor T1 may include a source portion S1, an active portion A1, a drain portion D1, and a gate portion G1. The second transistor T2 may include a source portion S2, an active portion A2, a drain portion D2, a gate portion G2, and an upper electrode UE.

The source portion S1, the active portion A1, and the drain portion D1 of the first transistor T1 may be defined by or formed from the semiconductor pattern, and the source portion S2, the active A2, and the drain portion D2 of the second transistor T2 may be defined by or formed from the semiconductor pattern. The source portions S1 and S2, and the drain portions D1 and D2 may extend in opposite directions from the active portions A1 and A2 on a cross section. FIG. 5 illustrates a part of a connection signal line SCL formed from a semiconductor pattern. Although not shown separately, the connection signal line SCL may be electrically connected to the drain D2 of the second transistor T2 on a plane.

A first insulating layer 10 may be disposed on the buffer layer BFL. The first insulating layer 10 may commonly overlap the plurality of pixels PX and cover the semiconductor pattern. The first insulating layer 10 may be an inorganic layer and/or an organic layer, and may have a single layer or multilayer structure. The first insulating layer 10 may include at least one selected from aluminum oxide, titanium oxide, silicon oxide, silicon oxynitride, zirconium oxide, and hafnium oxide. In an embodiment, the first insulating layer 10 may be a single-layer silicon oxide layer. In an embodiment, an insulating layer of the circuit element layer DP-CL which will be described later may be an inorganic layer and/or an organic layer, and may have a single layer or multilayer structure. The inorganic layer may include at least one material selected from the materials described above.

The gate portions G1 and G2 may be disposed on the first insulating layer 10. The gate portions G1 and G2 may be a part of a metal pattern. The gate portions G1 and G2 may overlap the actives A1 and A2. In the process of doping the semiconductor pattern, the gate portions G1 and G2 may have a pattern the same as that in a mask.

A second insulating layer 20 may be disposed on the first insulating layer 10. The second insulating layer 20 may cover the gates G1 and G2. The second insulating layer 20 may commonly overlap the plurality of pixels PX. The second insulating layer 20 may be an inorganic layer and/or an organic layer, and may have a single layer or multilayer structure. In an embodiment, the second insulating layer 20 may be a single-layer silicon oxide layer.

The upper electrode UE may be disposed on the second insulating layer 20. The upper electrode UE may overlap the gate portion G2. The upper electrode UE may be defined by a part of a metal pattern. In such an embodiment, a part of the gate portion G2 and the upper electrode UE overlapping thereof may define a capacitor, but not being limited thereto. Alternatively, the upper electrode UE may be omitted.

A third insulating layer 30 may be disposed on the second insulating layer 20. The third insulating layer 30 may cover the upper electrode UE. In the embodiment, the third insulating layer 30 may be a single-layer silicon oxide layer. A first connection electrode CNE1 may be disposed on the third insulating layer 30. The first connection electrode CNE1 may be connected to the connection signal line SCL through a contact hole CNT-1 defined through the first to third insulating layers 10, 20, and 30.

A fourth insulating layer 40 may be disposed on the third insulating layer 30. The fourth insulating layer 40 may cover the first connection electrode CNE1. The fourth insulating layer 40 may be a single-layer silicon oxide layer.

A fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 defined through the fourth insulating layer 40 and the fifth insulating layer 50.

A sixth insulating layer 60 may be disposed on the fifth insulating layer 50. The sixth insulating layer 60 may cover the second connection electrode CNE2. The sixth insulating layer 60 may be an organic layer.

A first electrode AE may be disposed on the sixth insulating layer 60. The first electrode AE may be connected to the second connection electrode CNE2 through a contact hole CNT-3 defined through the sixth insulating layer 60.

An opening OP may be defined in the pixel defining film PDL. The opening OP of the pixel defining film PDL may expose at least a part of the first electrode AE.

The display area DP-DA may include a light emitting area PXA and a light blocking area NPXA adjacent to the light emitting PXA. The light blocking area NPXA may surround the light emitting area PXA. In an embodiment, the light emitting area PXA is defined to correspond to a partial area of the first electrode AE exposed through the opening OP.

A hole control layer HCL may be commonly disposed in the light emitting area PXA and the light blocking area NPXA. The hole control layer HCL may include a hole transport layer, and may further include a hole injection layer. An emission layer EML may be disposed on the hole control layer HCL. The emission layer EML may be disposed in an area corresponding to the opening OP. In such an embodiment, the emission layer EML may be formed separately in each of the pixels.

An electron control layer ECL may be disposed on the emission layer EML. The electron control layer ECL may include an electron transport layer and may further include an electron injection layer. The hole control layer HCL and the electron control layer ECL may be commonly formed in the plurality of pixels using an open mask. A second electrode CE may be disposed on the electron control layer ECL. The second electrode CE may have an integral shape. The second electrode CE may be commonly disposed in the plurality of pixels PX.

The insulating layer TFL may be disposed on the second electrode CE. The insulating layer TFL may include a plurality of thin films. The insulating layer TFL may include an inorganic layer, an organic layer, and an inorganic layer which are sequentially stacked one on another, but not being limited thereto.

The inorganic layers may protect the display element layer DP-OLED from moisture and oxygen, and the organic layer may protect the display element layer DP-OLED from foreign substances such as dust particles. The inorganic layers may include a silicon nitride layer, a silicon oxynitride layer, a silicon oxide layer, a titanium oxide layer, or an aluminum oxide layer. The organic layer may include an acrylic-based organic layer, but is not limited thereto.

Figure 6A:
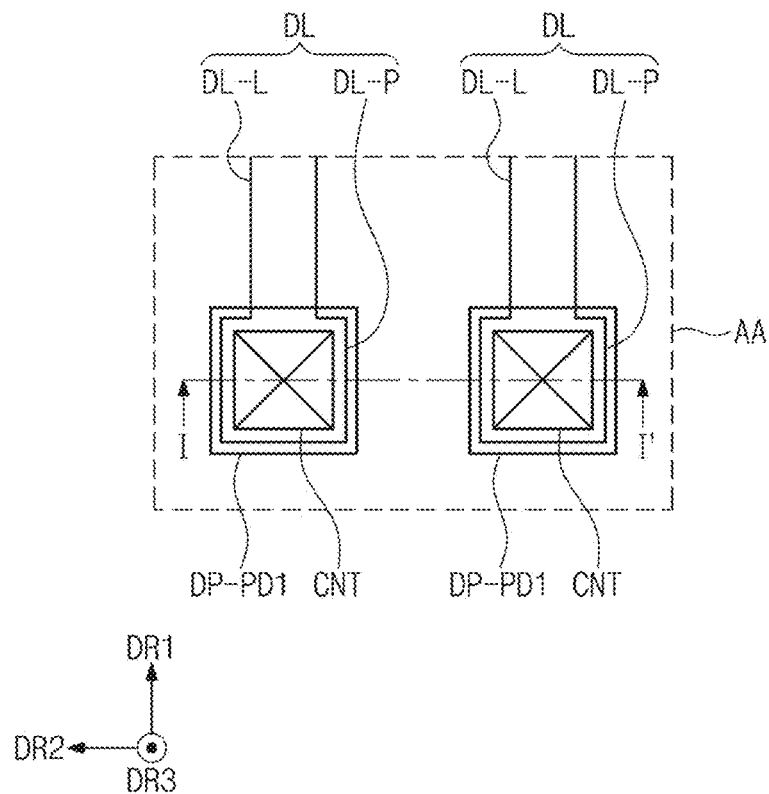
FIG. 6A is an enlarged view of area AA of FIG. 4 according to an embodiment of the invention.
Figure 6B:
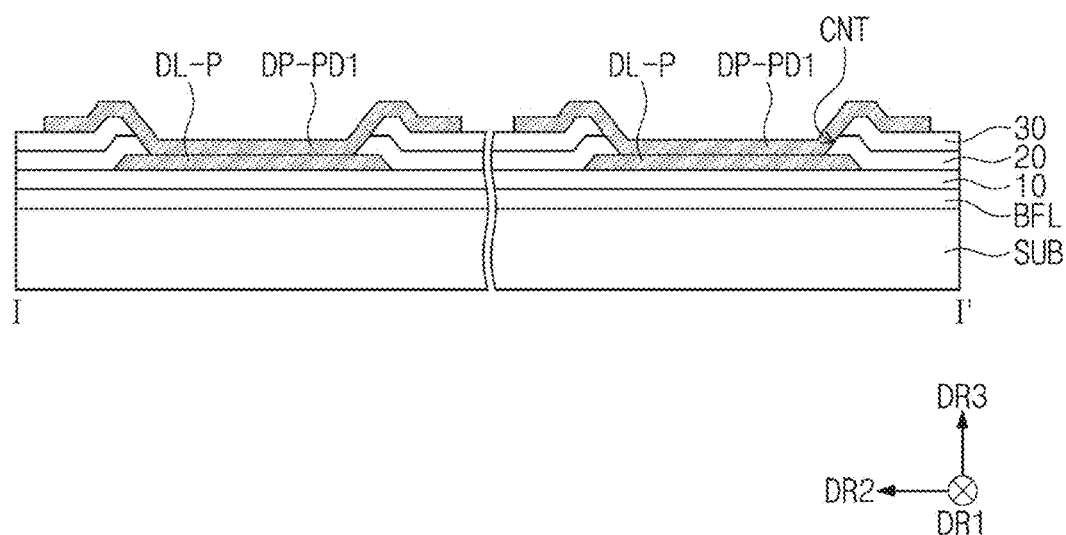
FIG. 6B is a cross-sectional view taken along line II' of FIG. 6A according to an embodiment of the invention.

FIG. 6A is an enlarged view of area AA of FIG. 4 according to an embodiment of the invention. FIG. 6B is a cross-sectional view taken along line II' of FIG. 6A according to an embodiment of the invention.

Referring to FIGS. 6A and 6B, the plurality of data lines DL may include a plurality of line portions DL-L and a plurality of pad portions DL-P. FIG. 6A shows only two data lines DL for convenience of illustration and description. A plurality of first pads DP-PD1 may electrically contact the plurality of pad portions DL-P, respectively. The plurality of pad portions DL-P may have a wider width (or a greater area at a same length in the first direction DR1) than the plurality of line portions DL-L. FIG. 6A illustrates an embodiment where the plurality of pad portions DL-P each have a rectangular shape, but the shape of each of the plurality of pad portions DL-P is not limited thereto.

In an embodiment, as shown in FIG. 6B, the pad portion DL-P of each of the plurality of data lines DL may be disposed on the second insulating layer 20. The third insulating layer 30 may cover the pad portion DL-P of the plurality of data lines DL. The plurality of first pads DP-PD1 may be disposed on the third insulating layer 30. A contact hole CNT exposing each of the plurality of pad portions DL-P may be defined in the third insulating layer 30. The plurality of first pads DP-PD1 may electrically contact the plurality of pad portions DL-P through the contact hole CNT defined through the third insulating layer 30.

Figure 7:
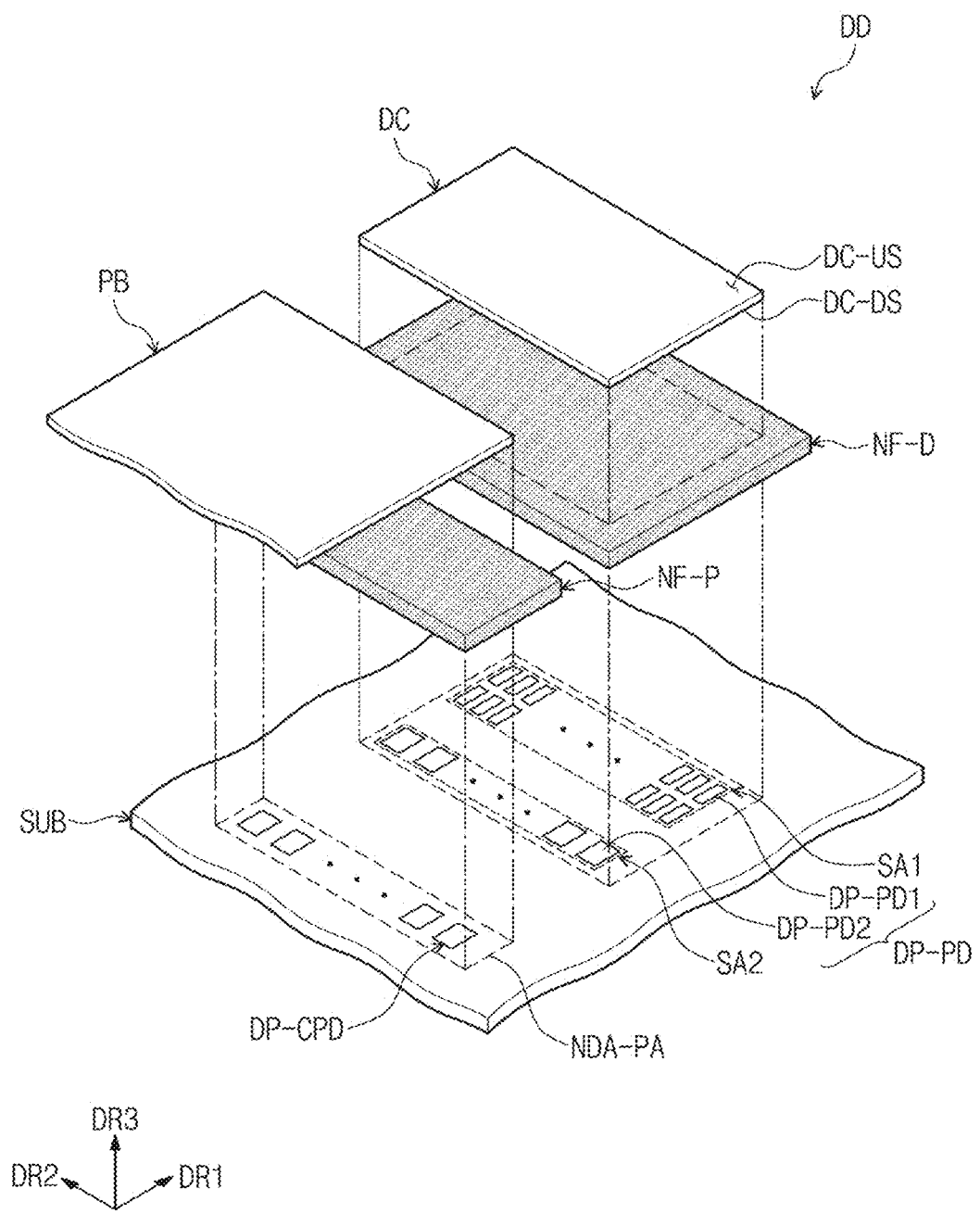
FIG. 7 is an exploded perspective view of a display device according to an embodiment of the invention.
Figure 8:
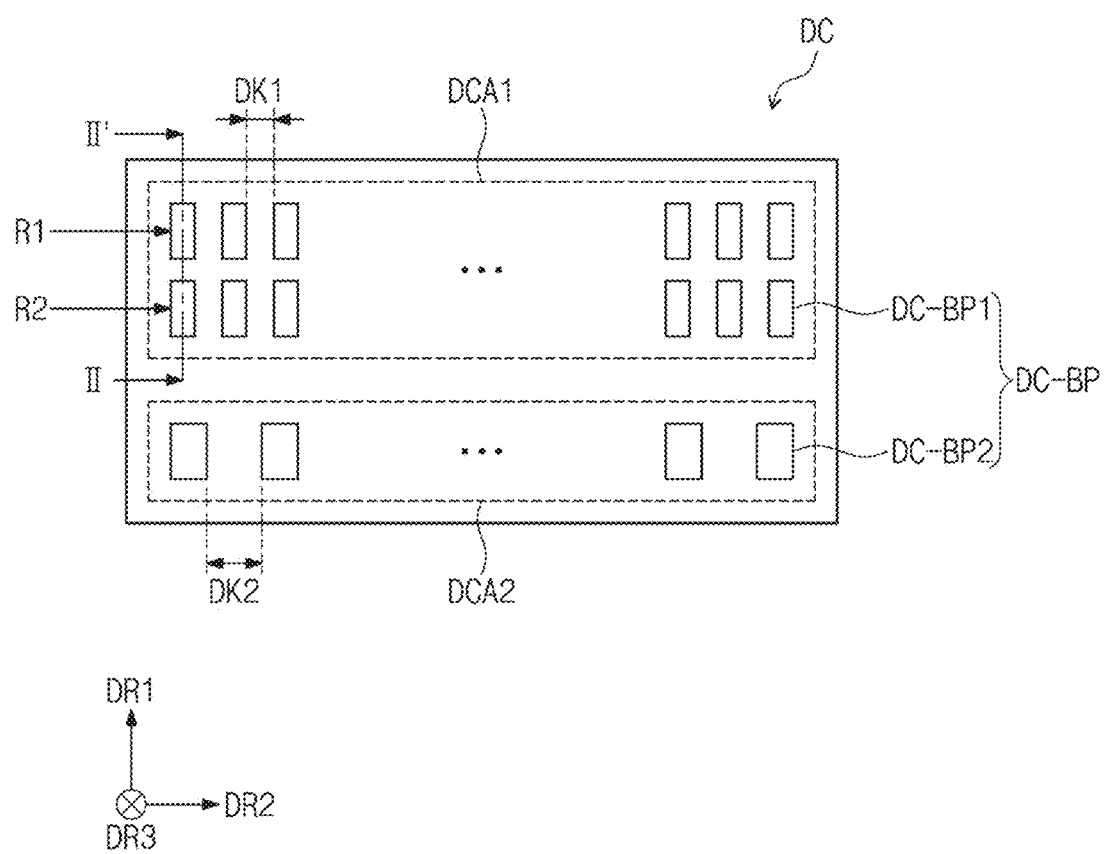
FIG. 8 is a plan view of an electronic component according to an embodiment of the invention.

FIG. 7 is an exploded perspective view of a display device according to an embodiment of the invention, and FIG. 8 is a plan view of an electronic component according to an embodiment of the invention.

Referring to FIGS. 7 and 8, an embodiment of the display device DD may further include a first adhesive member NF-D and a second adhesive member NF-P. The first adhesive member NF-D may be disposed between the electronic component DC and the base substrate SUB to bond the electronic component DC and the base substrate SUB. The second adhesive member NF-P may be disposed between the circuit board PB and the base board SUB to bond the circuit board PB and the base board SUB. On a plane, the first adhesive member NF-D may cover the electronic component DC.

The first adhesive member NF-D and the second adhesive member NF-P each may have non-conductive properties, and may be a film-type adhesive resin including a thermal initiator. In one embodiment, for example, the first adhesive member NF-D and the second adhesive member NF-P each may be a non-conductive film ("NCF"), but not being limited thereto. In one alternative embodiment, for example, the first adhesive member NF-D and the second adhesive member NF-P may be an anisotropic conductive film ("ACF"). Curing properties of the first adhesive member NF-D and the second adhesive member NF-P may change according to external heat.

The electronic component DC may include an upper surface DC-US and a lower surface DC-DS opposing the upper surface DC-US and facing the first adhesive member NF-D. The electronic component DC may include a plurality of bumps DC-BP each electrically contacting a corresponding one of the plurality of pads DP-PD disposed on the base substrate SUB.

In an embodiment, a first bump area DCA1 facing the first pad area SA1, and a second bump area DCA2 facing the second pad area SA2 may be defined in the electronic component DC. The plurality of bumps DC-BP may include a plurality of first bumps DC-BP1 disposed in the first bump area DCA1 and a plurality of second bumps DC-BP2 disposed in the second bump area DCA2.

The plurality of first bumps DC-BP1 may include first row bumps and second row bumps corresponding to the plurality of first pads DP-PD1 to be arranged in two rows R1 and R2. The plurality of second bumps DC-BP2 may include bumps corresponding to the plurality of second pads DP-PD2 to be arranged in one row. The first bump area DCA1 may have a greater area than the second bump area DCA2 on a plane.

A first interval DK1 between the two first bumps DC-BP1 adjacent in the second direction DR2 among the plurality of first bumps DC-BP1 may be less than a second interval DK2 between the two second bumps DC-BP2 adjacent in the second direction DR2 among the plurality of second bumps DC-BP2. The second interval DK2 may be greater than the first interval DK1 in the second direction DR2.

The number of the plurality of first bumps DC-BP1 is provided to be greater than the number of the plurality of second bumps DC-BP2, and the second interval DK2 between the plurality of second bumps DC-BP2 may thus be set less than the first interval DK1 between the plurality of first bumps DC-BP1.

In an embodiment, on a plane, an area of any one first bump among the plurality of first bumps DC-BP1 and an area of any one second bump among the plurality of second bumps DC-BP2 may be different from each other. In one embodiment, for example, an area of each of the plurality of second bumps DC-BP2 may be greater than an area of each of the plurality of first bumps DC-BP1.

The first interval between the two first pads DP-PD1 adjacent in the second direction DR2 among the plurality of first pads DP-PD1 may be less than the second interval between two second pads DP-PD2 adjacent in the second direction DR2 among the plurality of second pads DP-PD2. The second interval may be greater than the first interval in the second direction DR2.

The plurality of first pads DP-PD1 face in the third direction DR3 and electrically contact the plurality of first bumps DC-BP1, and the interval between two adjacent first pads DP-PD1 and the interval between two adjacent first bumps DC-BP1 may thus substantially correspond to each other. The plurality of second pads DP-PD2 face in the third direction DR3 and electrically contact the plurality of second bumps DC-BP2, and the interval between two adjacent second pads DP-PD2 and the distance between two adjacent second bumps DC-BP2 may thus substantially correspond to each other.

When viewed in a plane, an area of any one of the plurality of first pads DP-PD1 and an area of any one of the plurality of second pads DP-PD2 may be different from each other. In one embodiment, for example, an area of each of the plurality of second pads DP-PD2 may be greater than an area of each of the plurality of first pads DP-PD1.

According to the invention, the plurality of pads DP-PD and the plurality of bumps DC-BP are covered through the first adhesive member NF-D, and the plurality of bumps DC-BP and the plurality of pads DP-PD may thus be blocked from outside air. Accordingly, oxidation of the plurality of bumps DC-BP and the plurality of pads DP-PD due to outside air may be prevented.

The plurality of circuit pads PB-PD (see FIG. 4) of the circuit board PB may face the plurality of connection pads DP-CPD in the third direction DR3. The plurality of circuit pads PB-PD (see FIG. 4) may electrically contact the plurality of connection pads DP-CPD, respectively.

According to an embodiment of the invention, the plurality of circuit pads PB-PD (see FIG. 4) and the plurality of connection pads DP-CPD are covered through the second adhesive member NF-P, and the plurality of circuit pads PB-PD (see FIG. 4) and the plurality of connection pads DP-CPD may be blocked from outside air. Accordingly, oxidation of the plurality of circuit pads PB-PD (see FIG. 4) and the plurality of connection pads DP-CPD due to outside air may be prevented.

Figure 9:
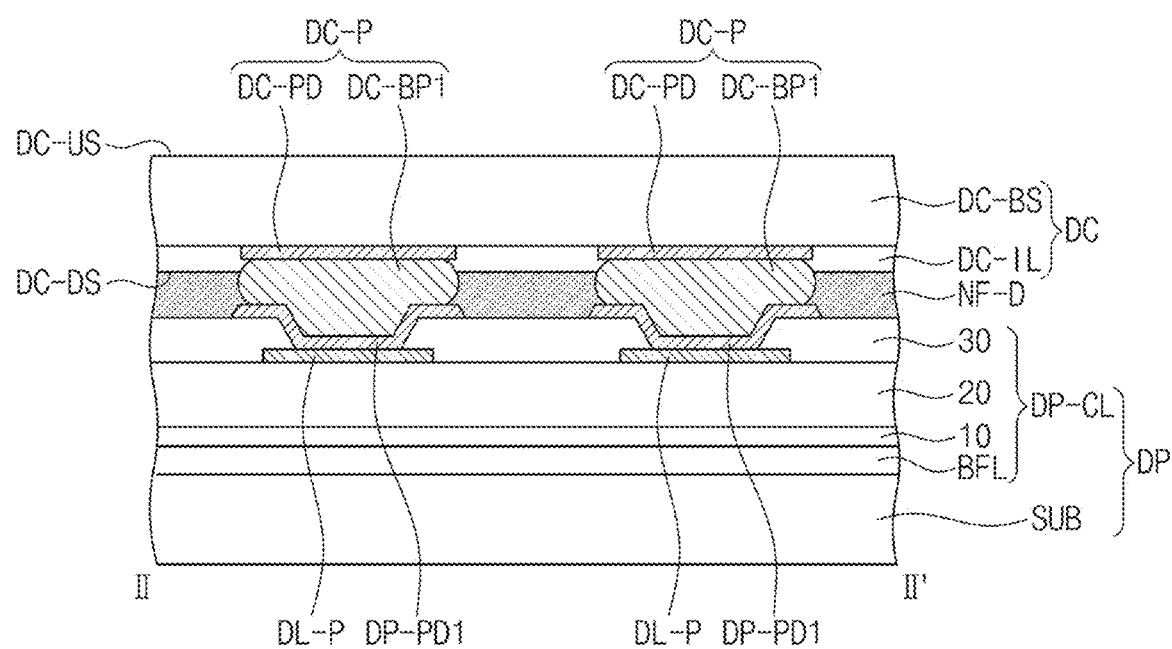
FIG. 9 is a cross-sectional view of a display device corresponding to a cross section taken along line II-II' of FIG. 8 according to an embodiment of the invention.

FIG. 9 is a cross-sectional view of a display device corresponding to a cross section taken along line II-II' of FIG. 8 according to an embodiment of the invention. In FIG. 9, the same or like reference numerals indicate the same or like components as those described above with reference to FIGS. 5 to 8, and any repetitive detailed descriptions thereof will be omitted or simplified.

Referring to FIG. 9, in an embodiment, the electronic component DC may include a substrate DC-BS, a driving pad portion DC-P, and a pad insulating layer DC-IL. The driving pad portion DC-P may include a driving pad DC-PD and a first bump DC-BP1.

An upper surface of the substrate DC-BS may correspond to an upper surface DC-US of the electronic component DC. A lower surface of the pad insulating layer DC-IL facing the display panel DP may correspond to a lower surface DC-DS of the electronic component DC. The substrate DC-BS may include a silicon material.

The driving pad DC-PD may be disposed on a lower surface of the substrate DC-BS. The driving pad DC-PD may be electrically connected to a circuit element of the electronic component DC. The pad insulating layer DC-IL may be disposed on the lower surface of the substrate DC-BS. A through hole exposing a part of the driving pad DC-PD may be defined in the pad insulating layer DC-IL. The first bump DC-BP1 may be disposed directly on the driving pad DC-PD.

In an embodiment, the first bump DC-BP1 may electrically contact the first pad DP-PD1 through an ultrasonic bonding method. Frictional heat due to ultrasonic vibration may be generated on contact surfaces between the first bump DC-BP1 and the first pad DP-PD1. In such an embodiment, external pressure is applied to the upper surface of the substrate DC-BS, and the contact surfaces between the first bump DC-BP1 and the first pad DP-PD1 may thus be adhered (or welded) to each other through frictional heat.

Figure 10:
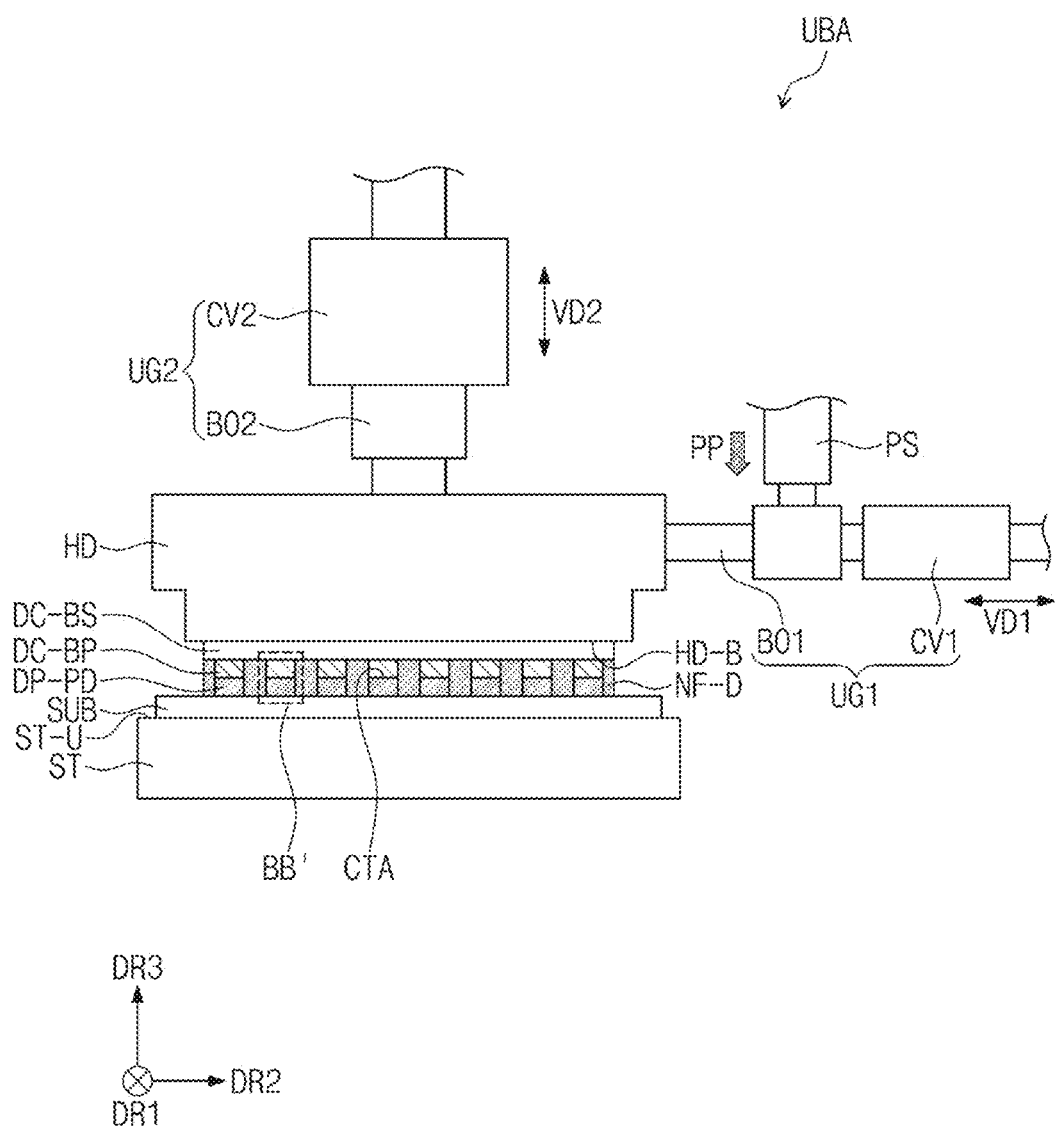
FIG. 10 illustrates an ultrasonic bonding apparatus according to an embodiment of the invention.

FIG. 10 illustrates an ultrasonic bonding apparatus according to an embodiment of the invention.

Referring to FIG. 10, an embodiment of an ultrasonic bonding apparatus UBA may include a stage ST, a head part HD, a first ultrasonic generator UG1, a second ultrasonic generator UG2, and a pressing part PS.

An upper surface ST-U defined by the first direction DR1 and the second direction DR2 may be defined in the stage ST. The display module DM (see FIG. 3) or the display panel DP (see FIG. 4) may be mounted on the upper surface ST-U of the stage ST. The stage ST may fix the base substrate SUB. In one embodiment, for example, the stage ST may vacuum-adsorb the base substrate SUB.

The head part HD may be disposed on the stage ST. The head part HD may be spaced apart from the stage ST in the third direction DR3. A lower surface HD-B facing the upper surface ST-U of the stage ST may be defined in the head part HD. The electronic component DC (see FIG. 7) may be disposed on the lower surface HD-B of the head part HD. The head part HD may fix the substrate DC-BS. In one embodiment, for example, the head part HD may vacuum-adsorb the substrate DC-BS.

The first ultrasonic generator UG1 may be coupled to the head part HD. In one embodiment, for example, the first ultrasonic generator UG1 may be coupled to a side surface of the head part HD. The first ultrasonic generator UG1 may vibrate in the second direction DR2 to provide a first vibration VD1 to a contact surface CTA of the pad DP-PD and the bump DC-BP. In one embodiment, for example, the first vibration VD1 may be provided to the contact surface CTA through the head part HD. The first ultrasonic generator UG1 may include a first converter CV1 and a first booster BO1.

The first converter CV1 may be connected to a power supply that provides electrical signals. The first converter CV1 may convert the electrical signals into physical vibration. In one embodiment, for example, the first converter CV1 may include a nickel vibrator, a ferrite vibrator, or a bolted lanjuban transducer or a bolt-clamped Langevin type transducer ("BLT") vibrator including piezoelectric ceramics, but not being limited thereto. The first converter CV1 may form the first vibration VD1 that vibrates in the second direction DR2.

The first booster BO1 may be connected between the first converter CV1 and the head part HD. The first booster BO1 may amplify the vibration generated from the first converter CV1. In one embodiment, for example, the first booster BO1 may amplify the amplitude of the first vibration VD1.

The second ultrasonic generator UG2 may be coupled to the head part HD. In one embodiment, for example, the second ultrasonic generator UG2 may be coupled to the upper surface of the head part HD. The second ultrasonic generator UG2 may vibrate in the third direction DR3 to provide a second vibration VD2 to the contact surface CTA of the pad DP-PD and the bump DC-BP. In one embodiment, for example, the second vibration VD2 may be provided to the contact surface CTA through the head part HD. The second ultrasonic generator UG2 may include a second converter CV2 and a second booster BO2.

The second converter CV2 may be connected to a power supply providing electrical signals. The second converter CV2 may convert the electrical signals into physical vibration. In one embodiment, for example, the second converter CV2 may include a nickel vibrator, a ferrite vibrator, or a BLT vibrator including piezoelectric ceramics, but not being limited thereto. The second converter CV2 may form the second vibration VD2 that vibrates in the third direction DR3.

The second booster BO2 may be connected between the second converter CV2 and the head part HD. The second booster BO2 may amplify the vibration generated from the second converter CV2. In one embodiment, for example, the second booster BO2 may amplify the amplitude of the second vibration VD2.

The pressing part PS may be disposed on the first ultrasonic generator UG1, but not being limited thereto. In one embodiment, for example, the pressing part PS may be disposed on the second ultrasonic generator UG2. The pressing part PS may apply pressure in the third direction DR3. In one embodiment, for example, the pressing part PS may include a cylinder that moves in the third direction DR3.

The base substrate SUB may be disposed on the stage ST. The plurality of pads DP-PD may be disposed on the base substrate SUB.

The substrate DC-BS may be disposed under the head part HD. The plurality of bumps DC-BP may be disposed under the substrate DC-BS.

The first adhesive member NF-D may be disposed between the base substrate SUB and the substrate DC-BS.

Figure 11A:
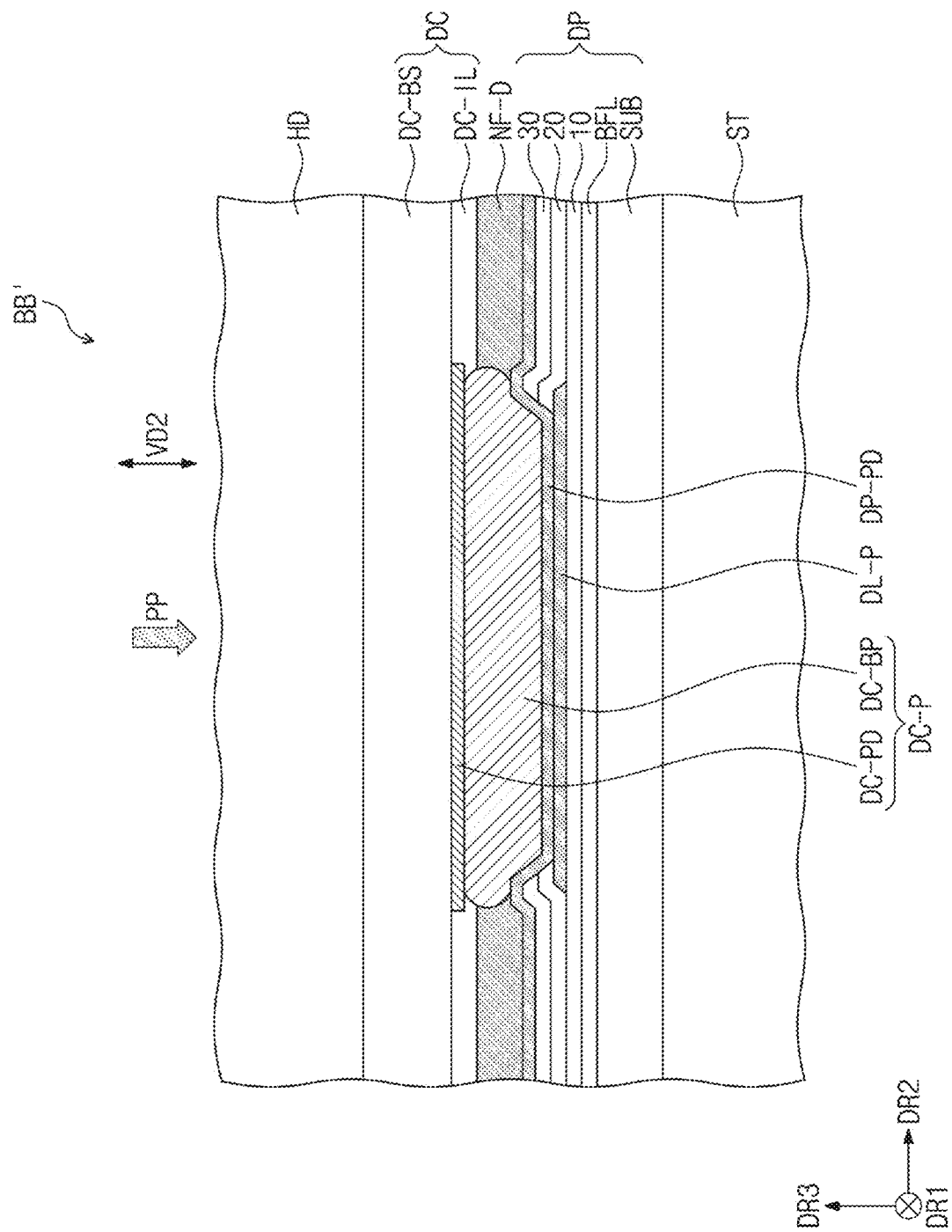
FIG. 11A is a cross-sectional view illustrating area BB' of FIG. 10 in providing a first vibration.
Figure 11B:
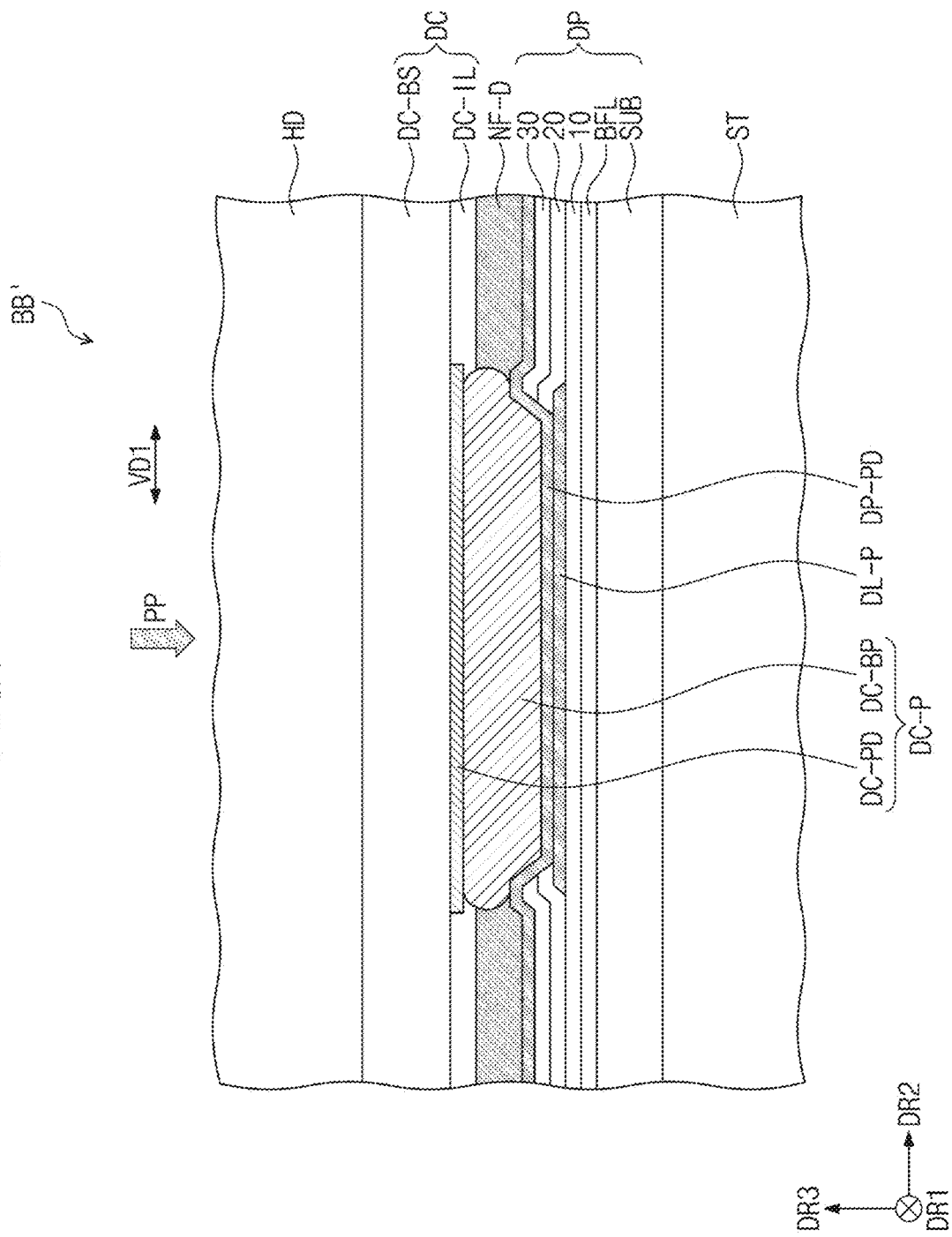
FIG. 11B is a cross-sectional view illustrating area BB' of FIG. 10 in providing a second vibration.

FIG. 11A is a cross-sectional view illustrating area BB' of FIG. 10 in providing a second vibration, and FIG. 11B is a cross-sectional view illustrating area BB' of FIG. 10 in providing a first vibration. In FIGS. 11A and 11B, the same or like reference numerals indicate the same or like components as those described above with reference to FIG. 9, and any repetitive detailed descriptions thereof will be omitted or simplified.

Referring to FIGS. 10, 11A, and 11B, in an embodiment, the head part HD may be disposed on the substrate DC-BS. The pressing part PS may apply pressure PP to the substrate DC-BS through the head part HD.

The first vibration VD1 and the second vibration VD2 may be provided to the contact surface CTA in which the plurality of pads DP-PD and the plurality of bumps DC-BP contact each other through the head part HD. The bump DC-BP and the pad DP-PD may electrically contact due to energy caused by the first vibration VD1 and the second vibration VD2, and pressure applied to the upper part of the substrate DC-BS.

The energy may be proportional to the product of pressure PP, the amplitude of the first vibration VD1 or the second vibration VD2, the frequency of the first vibration VD1 or the second vibration VD2, and the bonding time of the bump DC-BP and the pad DP-PD. The pressure PP may be controlled through the pressing part PS. The amplitude of the first vibration VD1 or the second vibration VD2 may be controlled through the first booster BO1 or the second booster BO2. The frequency of each of the first vibration VD1 and the second vibration VD2 may be a frequency corresponding to ultrasonic waves. In one embodiment, for example, the frequency may be in a range of about 40 kilohertz (kHz) to about 60 kHz.

The bonding of the display panel DP and the electronic component DC may include providing a first vibration VD1 to the contact surface CTA and providing a second vibration VD2 to the contact surface CTA. FIG. 11A may illustrate a process of providing a second vibration VD2, and FIG. 11B may illustrate a process of providing a first vibration VD1.

In the providing of the second vibration VD2, the second vibration VD2 applies vibration in the third direction DR3 and may thus push the first adhesive member NF-D disposed between the pad DP-PD and the bump DC-BP into a space between the base substrate SUB and the substrate DC-BS overlapping a non-pad area between the plurality of pads DP-PD or the plurality of bumps DC-BP. In the providing of the second vibration VD2, energy caused by the second vibration VD2 may be applied to the first adhesive member NF-D to increase the temperature of the first adhesive member NF-D. The first adhesive member NF-D having an increased temperature may have increased fluidity.

According to an embodiment of the invention, the first adhesive member NF-D may easily move to the space between the base substrate SUB and the substrate DC-BS. Accordingly, chances of having the first adhesive member NF-D disposed between the pad DP-PD and the bump DC-BP may be reduced, and the reliability of the electrical contact between the pad DP-PD and the bump DC-BP may be improved.

In the providing of the first vibration VD1, the first vibration VD1 may apply vibration in the second direction DR2 to bond the pad DP-PD and the bump DC-BP. A conductive bonding layer (not shown) may be formed between the pad DP-PD and the bump DC-BP. In one embodiment, for example, vibration having a frequency in the ultrasonic range is applied through the ultrasonic bonding apparatus UBA, and the pad DP-PD and the bump DC-BP may thus be rapidly rubbed together. Accordingly, friction energy may be generated between the pad DP-PD and the bump DC-BP. The surfaces of each of the pads DP-PD and the bumps DC-BP may be melted due to the friction energy. A diffusion layer may be formed between the melted pad DP-PD and the bump DC-BP, and a first metal included in the pad DP-PD and a second metal included in the bump DC-BP may thus mixed to each other to form the conductive bonding layer. The first metal and the second metal may be mixed and included in the conductive bonding layer.

When an electronic component is mounted on a display panel using an adhesive such as an ACF, short defects or open defects may be caused. In this case, conductive particles included in the anisotropic conductive film may be concentrated on a side surface of the bump of the electronic component to cause short defects between adjacent bumps, or the conductive particles of the anisotropic conductive film are not properly disposed at a position corresponding to the bump to cause open defects. In an embodiment of the invention, the ultrasonic bonding apparatus UBA may mount the electronic component DC on the display panel DP through an ultrasonic method. According to an embodiment of the invention, the first vibration VD1 and the second vibration VD2 may be applied to the contact surface CTA in which the pad DP-PD and the bump DC-BP are in contact, and energy may thus be applied. The energy may be applied to the pad DP-PD and the bump DC-BP to form the conductive bonding layer. The conductive bonding layer may have higher conductivity than the case of a direct bonding of the first metal and the second metal, using an adhesive. In such an embodiment, the number of processes may be reduced, and accordingly, the tact time may decrease.

In the bonding of the display panel DP and the electronic component DC, providing the first vibration VD1 is performed after providing the second vibration VD2. The ultrasonic bonding apparatus UBA uses the second vibration VD2 to push the first adhesive member NF-D overlapping the pad DP-PD and the bump DC-BP not to overlap the pad DP-PD and the bump DC-BP. Accordingly, after securing the contact surface CTA in which the pad DP-PD and the bump DC-BP contact, ultrasonic bonding may be performed using the first vibration VD1.

In the bonding of the display panel DP and the electronic component DC, providing of the second vibration VD2 and providing the first vibration VD1 may be performed together simultaneously. The ultrasonic bonding apparatus UBA simultaneously provides energy applied from each of the first vibration VD1 and the second vibration VD2 to the first adhesive member NF-D to rapidly increase the temperature of the first adhesive member NF-D. The first adhesive member NF-D may have improved fluidity. The first adhesive member NF-D may move not to overlap the pad DP-PD and the bump DC-BP, and the pad DP-PD and the bump DC-BP may be ultrasonically bonded. Therefore, the process time may be reduced, and the tact time may thus decrease.

Figure 12:
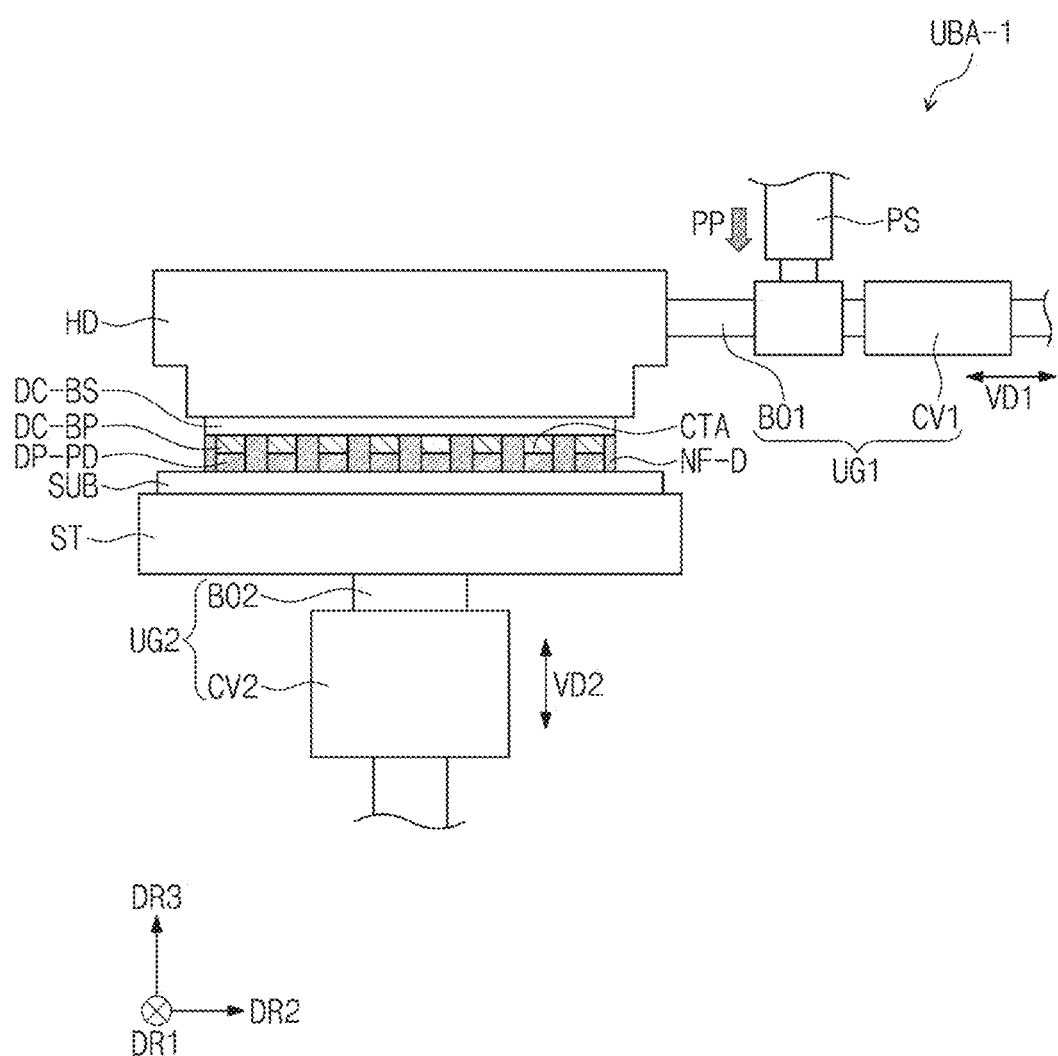
FIGS. 12 to 14 are views illustrating an ultrasonic bonding apparatus according to alternative embodiments of the invention.

FIG. 12 illustrates an ultrasonic bonding apparatus according to an alternative embodiment of the invention. In FIG. 12, the same or like reference numerals indicate the same or like components as those described above with reference to FIG. 10, and any repetitive detailed descriptions thereof will be omitted or simplified.

Referring to FIG. 12, an alternative embodiment of an ultrasonic bonding apparatus UBA-1 may include a stage ST, a head part HD, a first ultrasonic generator UG1, a second ultrasonic generator UG2, and a pressing part PS.

The first ultrasonic generator UG1 may be coupled to the head part HD. In one embodiment, for example, the first ultrasonic generator UG1 may be coupled to a side surface of the head part HD. The first ultrasonic generator UG1 may vibrate in the second direction DR2 to provide the first vibration VD1 to the contact surface CTA of the pad DP-PD and the bump DC-BP. In one embodiment, for example, the first vibration VD1 may be provided to the contact surface CTA through the head part HD.

The second ultrasonic generator UG2 may be coupled to the stage ST. In one embodiment, for example, the second ultrasonic generator UG2 may be coupled to the lower surface of the stage ST. The second ultrasonic generator UG2 may vibrate in the third direction DR3 to provide the second vibration VD2 to the contact surface CTA of the pad DP-PD and the bump DC-BP. In one embodiment, for example, the second vibration VD2 may be provided to the contact surface CTA through the stage ST. The second booster BO2 may be connected between the second converter CV2 and the stage ST.

Figure 13:
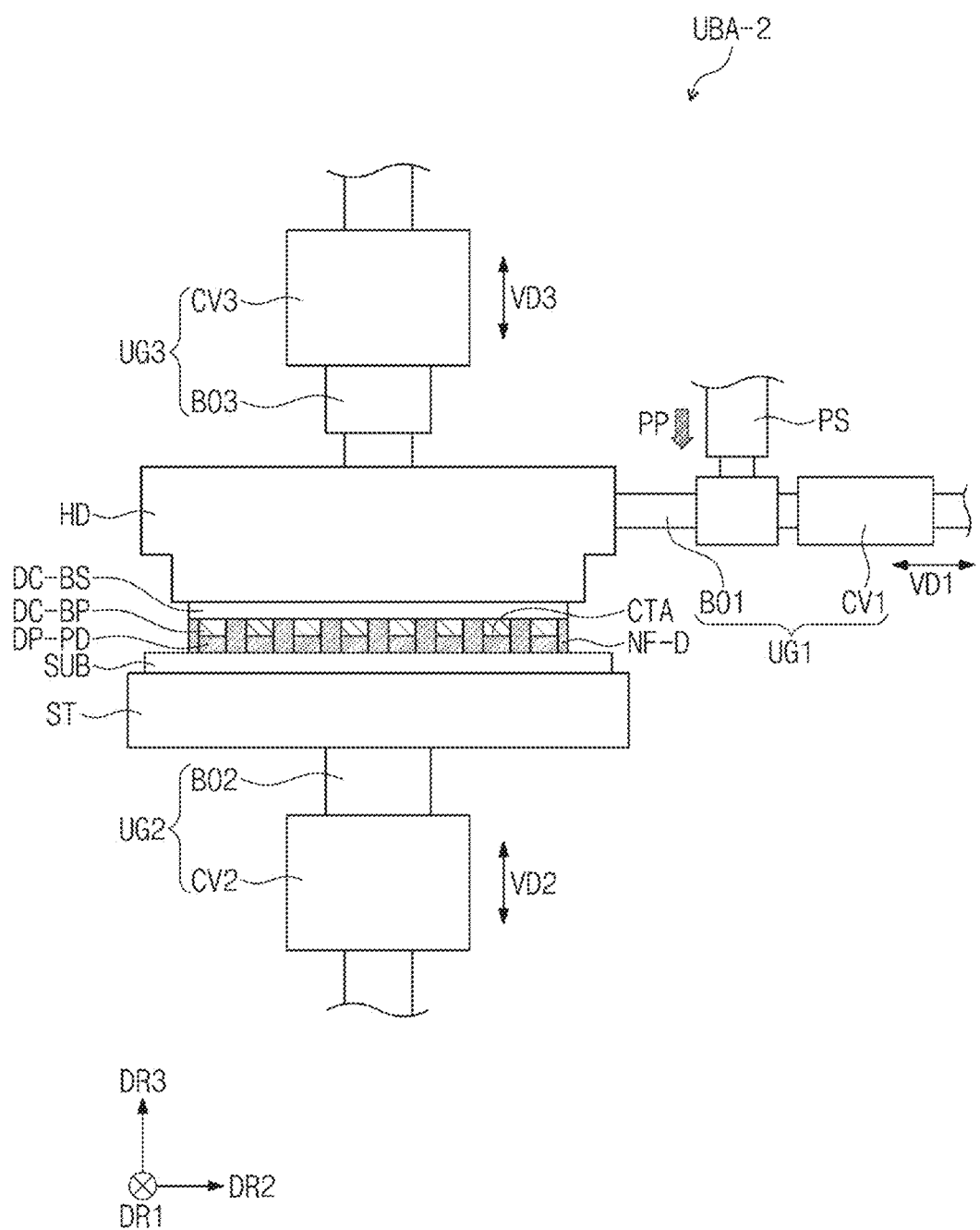

FIG. 13 illustrates an ultrasonic bonding apparatus according to another alternative embodiment of the invention. In FIG. 13, the same or like reference numerals indicate the same or like components as those described above with reference to FIG. 10, and any repetitive detailed descriptions thereof will be omitted or simplified.

Referring to FIG. 13, another alternative embodiment of an ultrasonic bonding apparatus UBA-2 may include a stage ST, a head part HD, a first ultrasonic generator UG1, a second ultrasonic generator UG2, a third ultrasonic generator UG3, and a pressing part PS.

The third ultrasonic generator UG3 may be coupled to the head part HD. In one embodiment, for example, the third ultrasonic generator UG3 may be coupled to the upper surface of the head part HD. The third ultrasonic generator UG3 may vibrate in the third direction DR3 to provide the third vibration VD3 to the contact surface CTA of the pad DP-PD and the bump DC-BP. In one embodiment, for example, the third vibration VD3 may be provided to the contact surface CTA through the head part HD. The third ultrasonic generator UG3 may include a third converter CV3 and a third booster BO3.

The third converter CV3 may be connected to a power supply providing electrical signals. The third converter CV3 may convert the electrical signals into physical vibration. In one embodiment, for example, the third converter CV3 may include a nickel vibrator, a ferrite vibrator, or a BLT vibrator including piezoelectric ceramics, but the type of the third converter CV3 is not limited thereto. The third converter CV3 may form the third vibration VD3 that vibrates in the third direction DR3.

The third booster BO3 may be connected between the third converter CV3 and the head part HD. The third booster BO3 may amplify the vibration generated from the third converter CV3. In one embodiment, for example, the third booster BO3 may amplify the amplitude of the third converter CV3.

Figure 14:
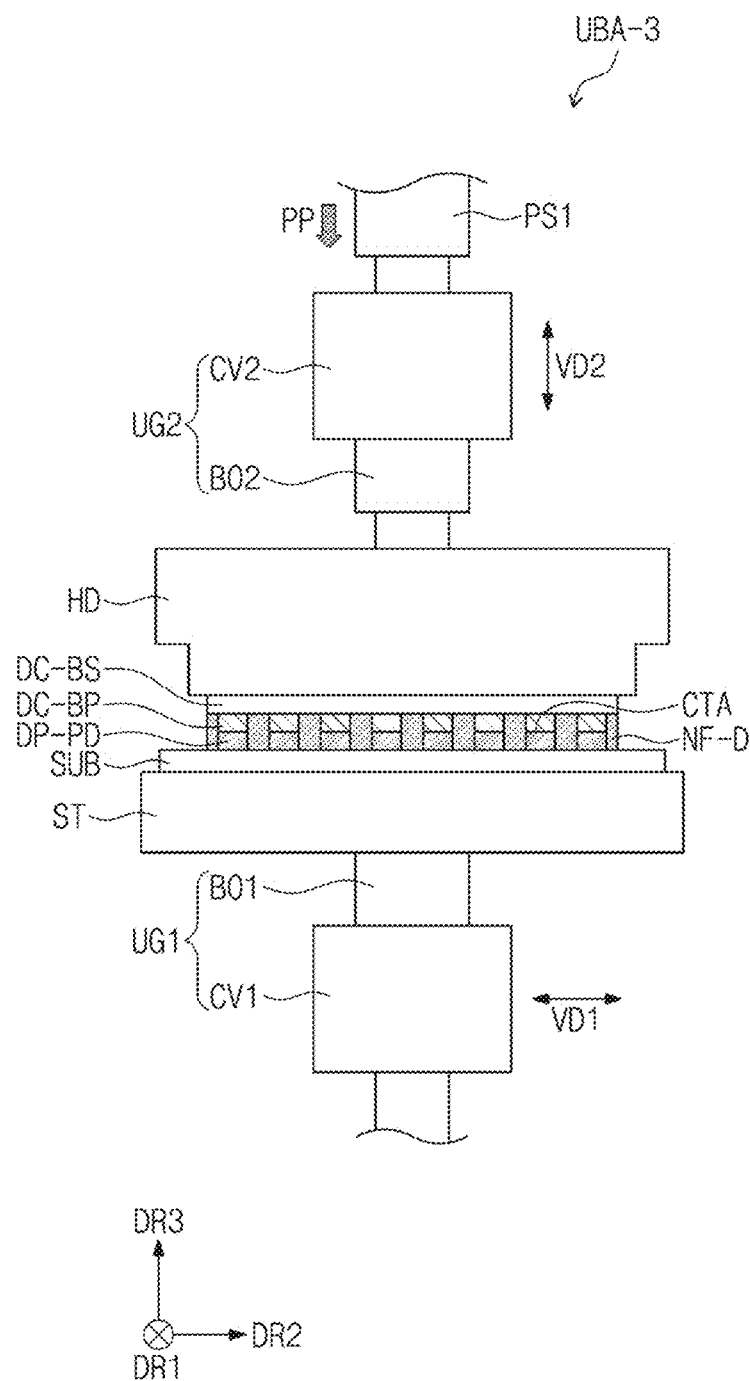

FIG. 14 illustrates an ultrasonic bonding apparatus according to another alternative embodiment of the invention. In FIG. 14, the same or like reference numerals indicate the same or like components as those described above with reference to FIG. 10, and any repetitive detailed descriptions thereof will be omitted or simplified.

Referring to FIG. 14, another alternative embodiment of an ultrasonic bonding apparatus UBA-3 may include a stage ST, a head part HD, a first ultrasonic generator UG1, a second ultrasonic generator UG2, and a pressing part PS.

The first ultrasonic generator UG1 may be coupled to the stage ST. In one embodiment, for example, the first ultrasonic generator UG1 may be coupled to the lower surface of the stage ST, but the bonding relationship of the first ultrasonic generator UG1 is not limited thereto. In one embodiment, for example, the first ultrasonic generator UG1 may be coupled to a side surface of the stage ST. The first ultrasonic generator UG1 may vibrate in the second direction DR2 to provide the first vibration VD1 to the contact surface CTA of the pad DP-PD and the bump DC-BP. In one embodiment, for example, the first vibration VD1 may be provided to the contact surface CTA through the stage ST. The first booster BO1 may be connected between the first converter CV1 and the stage ST.

The second ultrasonic generator UG2 may be coupled to the head part HD. In one embodiment, for example, the second ultrasonic generator UG2 may be coupled to the upper surface of the head part HD. The second ultrasonic generator UG2 may vibrate in the third direction DR3 to provide the second vibration VD2 to the contact surface CTA of the pad DP-PD and the bump DC-BP. In one embodiment, for example, the second vibration VD2 may be provided to the contact surface CTA through the stage ST.

According to embodiments of the invention, an ultrasonic bonding apparatus including a first ultrasonic generator and a second ultrasonic generator may bond a pad of a display panel and a bump of an electronic component to each other. In such embodiments, the first ultrasonic generator may vibrate in a first direction, and the second ultrasonic generator may vibrate in a thickness direction of the display panel. An adhesive member may be disposed between the pad and the bump. The second ultrasonic generator may vibrate in the thickness direction to move the adhesive member not to overlap the pad and the bump on a plane. Accordingly, the reliability of electrical contact between the pad and the bump may be improved.

According to embodiments of the invention, a first ultrasonic vibration may vibrate in the first direction to ultrasonically bond a pad and a bump. A first metal of the pad and a second metal of the bump are directly bonded to each other through ultrasonic bonding, thereby having higher conductivity than when bonding using an adhesive. Therefore, the reliability of the electrical contact between the pad and the bump may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An ultrasonic bonding apparatus comprising:
   a stage including an upper surface on a plane defined by a first direction and a second direction crossing the first direction;
   a head part spaced apart from the stage in a third direction crossing the first direction and the second direction;
   a first ultrasonic generator which vibrates in a direction parallel to the first direction; and
   a second ultrasonic generator which vibrates in a direction parallel to the third direction,
   wherein each of the first ultrasonic generator and the second ultrasonic generator is coupled to the stage or the head part.

2. The ultrasonic bonding apparatus of claim 1, wherein the first ultrasonic generator and the second ultrasonic generator vibrate together simultaneously.

3. The ultrasonic bonding apparatus of claim 1, wherein the first ultrasonic generator and the second ultrasonic generator are coupled to the head part.

4. The ultrasonic bonding apparatus of claim 1, wherein the first ultrasonic generator is coupled to the head part, and
the second ultrasonic generator is coupled to the stage.

5. The ultrasonic bonding apparatus of claim 4, further comprising:
a third ultrasonic generator coupled to the head part, wherein the third ultrasonic generator vibrates in the third direction.

6. The ultrasonic bonding apparatus of claim 1, wherein the first ultrasonic generator is coupled to the stage, and the second ultrasonic generator is coupled to the head part.

7. The ultrasonic bonding apparatus of claim 1, further comprising:
a pressing part disposed on the head part, wherein the pressing part presses the head part in the third direction.

8. The ultrasonic bonding apparatus of claim 1, wherein the first ultrasonic generator comprises:
a first converter which converts electrical signals into a first vibration vibrating in the first direction; and
a first booster which amplifies an amplitude of the first vibration.

9. The ultrasonic bonding apparatus of claim 8, wherein the second ultrasonic generator comprises:
a second converter which converts electrical signals into a second vibration vibrating in the third direction; and
a second booster which amplifies an amplitude of the second vibration.

10. The ultrasonic bonding apparatus of claim 9, wherein the head part provides at least one selected from the first vibration and the second vibration to a first object disposed on the stage and a second object fixed to the head part.

11. The ultrasonic bonding apparatus of claim 9, wherein each of the first vibration and the second vibration has a frequency in a range of about 40 kHz to about 60 kHz.

12. A method for ultrasonic bonding, the method comprising:
providing a display panel on a stage including an upper surface on a plane defined by a first direction and a second direction crossing the first direction;
fixing an electronic component to a head part spaced apart from the stage in a third direction crossing the first direction and the second direction;
having the display panel and the electronic component into contact with each other; and
bonding the display panel and the electronic component to each other,
wherein the bonding the display panel and the electronic component comprises:
providing a first vibration vibrating in a direction parallel to the first direction to a contact surface between the display panel and the electronic component; and
providing a second vibration vibrating in a direction parallel to the third direction to the contact surface.

13. The method of claim 12, wherein the providing the first vibration is performed after the providing the second vibration.

14. The method of claim 12, wherein the providing the first vibration and the providing the second vibration are performed together simultaneously.

15. The method of claim 12, wherein the first vibration and the second vibration are provided to the contact surface through the head part.

16. The method of claim 12, wherein
the first vibration is provided to the contact surface through the head part, and
the second vibration is provided to the contact surface through the stage.

17. The method of claim 16, wherein the bonding further comprises providing a third vibration vibrating in a direction parallel to the third direction to the contact surface,
wherein the third vibration is provided to the contact surface through the head part.

18. The method of claim 12, wherein
the first vibration is provided to the contact surface through the stage, and
the second vibration is provided to the contact surface through the head part.

19. The method of claim 12, wherein the providing the second vibration comprises pushing an adhesive member disposed between the display panel and the electronic component not to overlap the contact surface.

20. The method of claim 19, wherein the adhesive member comprises a non-conductive film.

* * * * *